(12) United States Patent
Ishikawa

(10) Patent No.: US 7,166,155 B2
(45) Date of Patent: Jan. 23, 2007

(54) HARD FILM AND HARD FILM-COATED TOOL

(75) Inventor: Takeshi Ishikawa, Chiba-ken (JP)

(73) Assignee: Hitachi Tools Engineering Ltd., Tokyo (JP)

(*) Notice: Subject to any disclaimer, the term of this patent is extended or adjusted under 35 U.S.C. 154(b) by 278 days.

(21) Appl. No.: 10/714,630

(22) Filed: Nov. 18, 2003

(65) Prior Publication Data
US 2004/0137281 A1 Jul. 15, 2004

(30) Foreign Application Priority Data

Nov. 19, 2002 (JP) ............................. 2002-334434
Nov. 25, 2002 (JP) ............................. 2002-340796
Oct. 21, 2003 (JP) ............................. 2002-360269

(51) Int. Cl.
*B32B 9/00* (2006.01)

(52) U.S. Cl. .................... 106/286.2; 428/697; 428/699

(58) Field of Classification Search ............ 106/286.2; 428/698, 697, 699, 701
See application file for complete search history.

(56) References Cited

U.S. PATENT DOCUMENTS

| | | | | |
|---|---|---|---|---|
| 6,254,984 B1 * | 7/2001 | Iyori | ......................... | 428/697 |
| 6,586,122 B2 * | 7/2003 | Ishikawa et al. | ............ | 428/698 |
| 6,730,392 B2 * | 5/2004 | Vetter et al. | ................ | 428/701 |
| 6,767,658 B2 * | 7/2004 | Yamamoto et al. | ......... | 428/698 |
| 6,919,288 B2 * | 7/2005 | Yamamoto et al. | ......... | 428/699 |

FOREIGN PATENT DOCUMENTS

| | | |
|---|---|---|
| DE | 102 33 222 A1 | 2/2003 |
| JP | 06-322517 | 11/1994 |
| JP | 10 025566 | 1/1997 |
| JP | 09-041127 | 2/1997 |
| JP | 2002-160129 | 6/2002 |

OTHER PUBLICATIONS

E. Lugscheider; Investigation of mechanical and tribological properties of CrAlN+C thin coatings deposited on cutting tools; Surface and Coatings Technology 174-175 (2003) 681-686: XP-002282705.
O. Knotek; Properties of arc-evaporated CrN and (Cr, Al)N coatings; Surface and Coatings Technology, 45 (1991) 53-58; XP-002282706.
Makoto Hirai; Oxidation behavior of Cr-Al-N-O thin films prepared by pulsed laser deposition; Thin Solid Films 407 (2002) 122-125; XP-002282707.

* cited by examiner

Primary Examiner—Archene Turner
(74) Attorney, Agent, or Firm—Sughrue Mion, PLLC

(57) ABSTRACT

A hard film formed by an arc-discharge ion-plating method, having a composition comprising metal components represented by $Al_xCr_{1-x-y}Si_y$, wherein x and y are respectively atomic ratios meeting $0.45 \leq x \leq 0.75$, $0 \leq y \leq 0.35$, and $0.5 \leq x+y < 1$, and non-metal components represented by $N_{1-\alpha-\beta-\gamma}B_\alpha C_\beta O_\gamma$, wherein $\alpha, \beta$ and $\gamma$ are respectively atomic ratios meeting $0 \leq \alpha \leq 0.15$, $0 \leq \beta \leq 0.35$, and $0.003 \leq \gamma \leq 0.25$, the hard film having an NaCl-type crystal structure, with a half width of $2\theta$ at an X-ray diffraction peak corresponding to a (111) face or a (200) face being 0.5–2.0°, and the hard film containing oxygen more in grain boundaries than in crystal grains.

17 Claims, 13 Drawing Sheets

Example 25

HARD FILM AND HARD FILM-COATED TOOL

FIELD OF THE INVENTION

The present invention relates to a hard film having excellent wear resistance, adhesion and high-temperature oxidation resistance, which is formed on cemented carbide, high-speed steel, die steel, etc., particularly to a hard film for being formed on wear-resistant members requiring high hardness such as cutting tools, forming dies, bearings, dies and rolls, and heat-resistant members such as internal combustion engine parts. The present invention also relates to a tool coated with such a hard film.

BACKGROUND OF THE INVENTION

As hard films having high-temperature oxidation resistance, various hard films of AlCr were proposed. Japanese Patent 3027502 discloses a wear-resistant amorphous hard film with high-hardness having a composition represented by the general formula of $(Al_aM_b)_{100-c}X_c$, wherein M is at least one element selected from the group consisting of Ti, Ta, V, Cr, Zr, Nb, Mo, Hf, W. Fe, Co, Ni, Cu and Mn, X is at least one element selected from the group consisting of N, O and C, and a, b and c are atomic % meeting $60\% \leq a \leq 98.5\%$, $1.5\% \leq b \leq 40\%$, $0\% < c \leq 65\%$, and $a+b=100\%$. However, this amorphous film has a Knoop hardness of about 21 GPa at most, insufficient in wear resistance and adhesion.

Japanese Patent 3039381 discloses a method comprising generating a vapor mixture of Al and Cr from a target composed of 25–50 atomic % of Al and 75–50 atomic % of Cr disposed in a vacuum chamber by arc discharge, and simultaneously introducing a nitrogen gas into the vacuum chamber to cause a reaction between the vapor mixture and the nitrogen gas, thereby forming an Al—Cr—N composite hard film having excellent high-temperature oxidation resistance that prevents oxidation even at 800–900° C. on a substrate. Also, JP 2002-160129 A discloses a method for surface-treating a tool, comprising forming an intermediate layer of Ti, Cr, Si or Al on a substrate surface, and coating the intermediate layer with a hard film of AlCrN. These hard films are made of AlCr nitride having a high-temperature oxidation resistance of about 1000° C. However, they do not have oxidation resistance exceeding 1000° C. Further, these hard films had as insufficient hardness Hv as about 21 GPa, poor in wear resistance.

OBJECTS OF THE INVENTION

Accordingly, an object of the present invention is to provide a hard film having excellent adhesion, hardness, high-temperature oxidation resistance and wear resistance.

Another object of the present invention is to provide a tool coated with such a hard film.

DISCLOSURE OF THE INVENTION

The first hard film of the present invention is formed by an arc-discharge ion-plating method, and has a composition comprising metal components represented by $Al_xCr_{1-x}$, wherein x is an atomic ratio meeting $0.45 \leq x \leq 0.75$, and non-metal components represented by $N_{1-\alpha-\beta-\gamma}B_\alpha C_\beta O_\gamma$, wherein α, β and γ are respectively atomic ratios meeting $0 \leq \alpha \leq 0.15$, $0 \leq \beta \leq 0.35$, and $0.01 \leq \gamma \leq 0.25$, with the maximum X-ray diffraction intensity in a (200) face or a (111) face, and with the binding energy of Al and/or Cr to oxygen in a range of 525–535 eV in an X-ray photoelectron spectroscopy.

In the first hard film, x is preferably 0.5–0.7. α is preferably 0–0.12, more preferably 0–0.08. β is preferably 0–0.2, more preferably 0–0.1. γ is preferably 0.01–0.2.

The second hard film of the present invention is formed by an arc-discharge ion-plating method, and has a composition comprising metal components represented by $Al_xCr_{1-x-y}Si_y$, wherein x and y are respectively atomic ratios meeting $0.45 \leq x \leq 0.75$, and $0 < y \leq 0.35$, and non-metal components represented by $N_{1-\alpha-\beta-\gamma}B_\alpha C_\beta O_\gamma$, wherein α, β and γ are respectively atomic ratios meeting $0 \leq \alpha \leq 0.15$, $0 \leq \beta \leq 0.35$, and $\gamma \leq 0.25$, with the binding energy of Al, Cr and/or Si to oxygen in a range of 525–535 eV in an X-ray photoelectron spectroscopy.

In the second hard film, x is preferably 0.5–0.7. The upper limit of y is preferably 0.2, and the lower limit of y is preferably 0.005, more preferably 0.01. α is preferably 0–0.12, more preferably 0–0.08. γ is preferably 0–0.2, more preferably 0–0.1. γ is preferably 0.01–0.25, more preferably 0.01–0.2.

In the second hard film, Si preferably exists in the form of a nitride, an oxide and a metal, and when the relative intensities of the Si metal and its nitride and oxide determined by X-ray photoelectron spectroscopy are represented by I(Si), I(Si—N) and I(Si—O), respectively, with I(Si)+I(Si—N)+I(Si—O)=100%, I(Si—N) is preferably 52% or more. This hard film preferably has a crystal structure having the maximum X-ray diffraction intensity in a (200) face or a (111) face.

The third hard film of the present invention is formed by an arc-discharge ion-plating method, and has a composition comprising metal components represented by $Al_xCr_{1-x-y}Si_y$, wherein x and y are respectively atomic ratios meeting $0.45 \leq x \leq 0.75$, $0 \leq y \leq 0.35$, and $0.5 \leq x+y < 1$, and non-metal components represented by $N_{1-\alpha-\beta-\gamma}B_\alpha C_\beta O_\gamma$, wherein α, β and γ are respectively atomic ratios meeting $0 \leq \alpha \leq 0.15$, $0 \leq \beta \leq 0.35$, and $0.003 \leq \gamma \leq 0.25$, and an NaCl-type crystal structure, with a half width of 2θ at an X-ray diffraction peak corresponding to a (111) face or a (200) face being 0.5–2.0°, the above hard film containing oxygen more in grain boundaries than in crystal grains.

In the third hard film, x is preferably 0.5–0.7. y is preferably 0–0.2, more preferably 0–0.1. α is preferably 0–0.12, more preferably 0–0.08. β is preferably 0–0.2, more preferably 0–0.1. γ is preferably 0.01–0.25, more preferably 0.01–0.2.

The third hard film preferably has the binding energy of Al, Cr and/or Si to oxygen in a range of 525–535 eV in an X-ray photoelectron spectroscopy. The third hard film preferably has the maximum oxygen concentration in a region of depth within 500 nm from the outermost surface. It preferably meets $0.3 < I(200)/I(111) < 12$, wherein I(111) and I(200) are the X-ray diffraction intensities of a (111) face and a (200) face, respectively.

In the first to third hard films, a ratio of the total amount of non-metal elements (N+B+C+O) to the total amount of metal elements (Al+Cr or Al+Cr+Si) is stoichiometrically more than 1, preferably 1.1 or more. The upper limit of this ratio is preferably 1.7. If this ratio exceeded 1.7, then the hard film would have low peeling resistance.

From the aspect of balance between wear resistance and adhesion, the elastic recovery ratio E of the hard film of the present invention is preferably 28–42%, more preferably 30–40%. Particularly, the elastic recovery ratios E of the first and second hard films are preferably 30–40%, and the elastic recovery ratio E of the third hard film is preferably 28%–40%. The elastic recovery ratio E may be determined by the equation of 100−[(contact depth)/(the maximum displacement at the maximum load)]. The contact depth and the maximum displacement at the maximum load can be determined by a nano-indentation method (W. C. Oliverand, G. M. Pharr: J. Mater. Res., Vol. 7, NO. 6, June 1992, pp. 1564–1583).

DETAILED DESCRIPTION OF THE PREFERRED EMBODIMENTS

Figure 1:
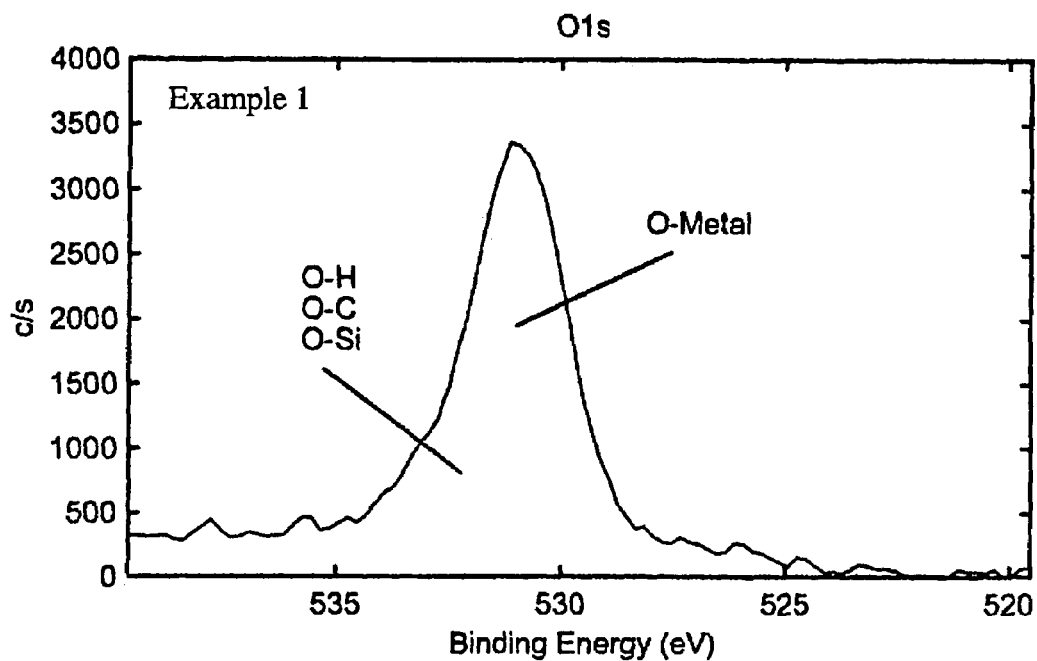
FIG. 1 is a graph showing the binding energy of Cr—O and Al—O in Example 1.

[1] Hard Film (A) Composition (1) First Hard Film

The first hard film has a composition comprising metal components represented by $Al_xCr_{1-x}$, wherein x is an atomic ratio meeting $0.45 \leq x \leq 0.75$, and non-metal components represented by $N_{1-\alpha-\beta-\gamma}B_\alpha C_\beta O_\gamma$, wherein $\alpha$, $\beta$ and $\gamma$ respectively atomic ratios meeting $0 \leq \alpha \leq 0.15$, $0 \leq \beta \leq 0.35$, and $0.01 \leq \gamma \leq 0.25$.

When the amount x of Al is less than 0.45, there are no sufficient effects of improving the hardness and high-temperature oxidation resistance of the hard film. On the other hand, when x exceeds 0.75, the hard film has an excess residual compression stress, resulting in self-destruction immediately after coating and thus drastic decrease in strength. The preferred range of x is 0.5–0.7.

The addition of boron is preferable because it provides the hard film with improved resistance to deposit to a mating member, and a decreased friction coefficient at high temperatures. However, when the amount a of boron exceeds 0.15, the film becomes brittle. The upper limit of $\alpha$ is preferably 0.12, more preferably 0.08.

The addition of carbon is effective to increase the hardness of the hard film and reduce the friction coefficient thereof at room temperature. When the amount $\beta$ of carbon exceeds 0.35, the film becomes brittle. The upper limit of $\beta$ is preferably 0.2, more preferably 0.1.

Oxygen has effects of improving the hardness, high-temperature oxidation resistance and wear resistance of the hard film, as well as the adhesion of the hard film to a substrate. To achieve such effects, the amount $\gamma$ of oxygen should be 0.01–0.25. When $\gamma$ is less than 0.01, the addition of oxygen does not provide sufficient effects. On the other hand, when $\gamma$ exceeds 0.25, the film has extremely decreased hardness, resulting in poor wear resistance. $\gamma$ is preferably 0.01–0.2, particularly 0.02–0.2.

A ratio of the total amount of non-metal elements (N+B+C+O) to the total amount of metal elements (Al+Cr) is stoichiometrically more than 1, preferably 1.1 or more. The upper limit of this ratio is preferably 1.7.

(2) Second Hard Film

The second hard film has a composition comprising metal components represented by $Al_xCr_{1-x-y}Si_y$, and non-metal components represented by $N_{1-\alpha-\beta-\gamma}B_\alpha C_\beta O_\gamma$. The composition of the second hard film is the same as that of the first hard film except that the former contains Si. Accordingly, explanation will thus be made only on Si. The other elements may be the same as in the first hard film. With respect to the structure and characteristics, too, the second hard film may be the same as the first hard film unless otherwise mentioned.

The addition of Si makes the hard film harder, drastically improving its wear resistance. The amount y of Si is generally 0.35 or less, preferably 0.2 or less. When y is more than 0.35, the hard film has an excess residual compression stress, which may cause self-destruction and form hexagonal crystals immediately after coating, resulting in drastic decrease in strength. The lower limit of y is preferably 0.005, more preferably 0.01.

A ratio of the total amount of non-metal elements (N+B+C+O) to the total amount of metal elements (Al+Cr+Si) is stoichiometrically more than 1, preferably 1.1 or more. The upper limit of this ratio is preferably 1.7.

(3) Third Hard Film

The third hard film has a composition comprising metal components represented by $Al_xCr_{1-x-y}Si_y$, wherein x and y are respectively atomic ratios meeting $0.45 \leq x \leq 0.75$, $0 \leq y \leq 0.35$, and $0.5 \leq x+y < 1$, and non-metal components represented by $N_{1-\alpha-\beta-\gamma}B_\alpha C_\beta O_\gamma$, wherein $\alpha$, $\beta$ and $\gamma$ are respectively atomic ratios meeting $0 \leq \alpha \leq 0.15$, $0 \leq \beta \leq 0.35$, and $0.003 \leq \gamma \leq 0.25$. The composition of the third hard film is the same as that of the first hard film except for the inclusion of Si and the content of O. Accordingly, the amounts of Si and O will be explained here. With respect to the amounts of the other elements, the third hard film may be the same as the first hard film, and with respect to the structure and characteristics, they may be the same unless otherwise mentioned.

The addition of Si provides the hard film with higher hardness, drastically improving its wear resistance. The amount y of Si is generally 0–0.35, preferably 0–0.2, more preferably 0–0.1. When y exceeds 0.35, a residual compression stress in the hard film becomes excessive, which may cause self-destruction and form hexagonal crystals immediately after coating, resulting in drastic decrease in strength. Because the lower limit of y is 0, the third hard film may contain no Si.

The amount $\gamma$ of oxygen is 0.003–0.25. When $\gamma$ is less than 0.003, there is no effect by the addition of oxygen. On the other hand, when $\gamma$ is more than 0.25, the film has extremely low hardness, and thus poor wear resistance. The preferred lower limit of $\gamma$ is 0.01, while its preferred upper limit is 0.2.

A ratio of the total amount of non-metal elements (N+B+C+O) to the total amount of metal elements (Al+Cr+Si) is stoichiometrically more than 1, preferably 1.1 or more. The upper limit of this ratio is preferably 1.7.

(B) Crystal Structure and Characteristics (1) Crystal Structure

Any of the hard films of the present invention has the maximum X-ray diffraction intensity in a (200) face or a (111) face. The half width of 2θ in the X-ray diffraction peak corresponding to the (111) face or the (200) face is preferably 0.5–2.0°. A ratio [I(200)/I(111)] of the X-ray diffraction intensities of the (111) face and the (200) face is preferably 0.3–12. When I(200)/I(111) is less than 0.3, the hard film has such low crystallinity that irregular wear conspicuous in the conventional amorphous hard films is likely to occur. On the other hand, when I(200)/I(111) exceeds 12, the film hardness decreases, resulting in the deterioration of wear resistance. It is thus clear that any of the hard films of the present invention has an NaCl-type crystal structure. Because of such crystal structure, the hard films have excellent toughness and adhesion to a substrate.

In the case of the hard film containing Si, I(Si—N) is preferably 52% or more, when the relative intensities of the Si metal and its nitride and oxide determined by X-ray photoelectron spectroscopy are represented by I(Si), I(Si—N) and I(Si—O), respectively, with I(Si)+I(Si—N)+I(Si—O)=100%. The hard film meeting this condition has high hardness and thus excellent wear resistance.

(2) Bonding to Oxygen

When a residual compression stress increases in the hard film, the film hardness generally becomes higher, and its adhesion to a substrate tends to deteriorate. Because hardness and adhesion are thus in a trade-off relation, high hardness has conventionally been sought while sacrificing the adhesion to a substrate to some extent. According to the present invention, oxygen is added to a film of AlCr or AlCrSi, and controlled to exist more in grain boundaries than in crystal grains, to suppress the diffusion of oxygen into the hard film from outside, thereby drastically improving oxidation resistance. As a result, it is possible to provide a hard film having high hardness, extremely decreased residual compression stress, and extremely improved adhesion to a substrate.

The hard film of the present invention containing a predetermined amount of oxygen has the binding energy of Al and/or Cr (or Al, Cr and/or Si) to oxygen in 525–535 eV in X-ray photoelectron spectroscopy. The existence of Al—O and/or Cr—O (or Al—O, Cr—O and/or Si—O) makes obscure grain boundaries functioning as oxygen diffusion paths, thereby making it difficult for oxygen to diffuse in the hard film. Also, because Cr and Al (and Si) exist in the form of nitrides, oxides and oxinitrides, the hard film is dense, thereby suppressing the oxidation of the hard film and having high hardness.

When there is the maximum oxygen concentration in the hard film in a region of depth within 500 nm from the outermost surface in a film thickness direction, the hard film has suppressed oxygen diffusion, extremely improved high-temperature oxidation resistance, and lowered friction. On the other hand, when there is the maximum oxygen concentration in a region of depth exceeding 500 nm, the hard film has low wear resistance.

(3) Elastic Recovery Ratio

In any of the hard films of the present invention, its elastic recovery ratio E determined by a nano-indentation method is preferably 28–42%. The elastic recovery ratio E in this range can be achieved by controlling film-forming conditions such as bias voltage, the partial pressure of each reaction gas, a substrate temperature, etc. When E exceeds 42%, a residual compression stress becomes too high in the hard film, resulting in poor toughness and lowered adhesion to a substrate. On the other hand, when E is less than 28%, the hard film is insufficient in strength and wear resistance, suffering from irregular wear, etc. The elastic recovery ratio E is preferably 30–40%, particularly 32–38%.

(C) Combination with Another Hard Film

With another hard film formed on the hard film of the present invention, the wear resistance can be further improved. Usable as another hard film is (a) a hard film comprising at least one metal element selected from the group consisting of Ti, Cr, Al and Si, and N, or N and at least one non-metal element selected from the group consisting of C, O and B, (b) a hard carbon film, or (c) a hard boron nitride film. These hard films may be laminated in arbitrary combination. Al, Ti and/or Cr in another hard film form oxides (TiO$_2$, Al$_2$O$_3$, Cr$_2$O$_3$), making layer separation difficult. Accordingly, the hard film exhibits excellent wear resistance even in a kinetic wear environment at high temperatures.

[2] Production of Hard Film

To form the hard film of the present invention containing oxygen, namely having Al—O and/or Cr—O (or Al—O, Cr—O and/or Si—O), it is preferable to conduct an arc-discharge ion-plating method, using (a) an oxygen-containing metal target as an evaporation source, and/or (b) an oxygen-containing reaction gas. When the oxygen-containing metal target is used, the oxygen content in the metal target is preferably 2000 ppm or more, more preferably 2500 ppm or more. The upper limit of the oxygen content in the metal target is preferably 9800 ppm. When the upper limit of the oxygen content exceeds 9800 ppm, arc discharge becomes unstable, resulting in the tendency of increasing large particles and thus making the hard film surface rougher. For instance, the oxygen content in the metal target is 1800 ppm or less, there is substantially no difference in an oxygen concentration between crystal grains and boundaries. The oxygen concentration is determined from the intensity of an oxygen peak measured by electron-beam energy-loss spectroscopy, to determine a ratio P of the oxygen concentration in grain boundaries to that in crystal grains. P should be more than 1 and is preferably 4 or less.

An arc-discharge ion-plating apparatus comprises a vacuum chamber, an arc-discharge evaporation source insulated from the vacuum chamber, and a substrate holder. With electric current supplied to the arc-discharge evaporation source, arc discharge is caused on the target to ionize metal components. The substrate is heated to 500° C., for instance, by a heater disposed in the vacuum chamber. A film-forming atmosphere in the vacuum chamber contains active gases such as $N_2$, $O_2$, $C_2H_2$, etc. While applying a negative bias voltage to the substrate holder, a hard film comprising target metals and N or N and O and/or C is caused to grow on the substrate.

When a bias voltage is applied to the substrate, the resultant hard film can have higher adhesion to the substrate. To obtain a dense hard film having excellent adhesion, high-temperature oxidation resistance and wear resistance, the film-forming conditions are preferably a gas pressure of 1.5–15 Pa, particularly 2–5 Pa, a substrate temperature of 450° C. to 700° C., and as low bias voltage as –15 V to –300 V.

[3] Hard Film-coated Members

The hard film of the present invention having excellent adhesion is preferably formed on substrates such as various tools such as drills, taps, reamers, end mills, gear-cutting tools, broaches and exchangeable inserts, molding dies, etc. Preferred materials for the substrate include high-speed steel, die steel, heat-resistant steel, bearing steel, austenitic stainless steel, cemented carbide, cermets, etc. The hard film of the present invention epitaxially grows on a substrate comprising, for instance, Fe, Ni and/or Co. Accordingly, it is possible to provide hard film-coated members having, excellent high-temperature oxidation resistance and wear resistance without suffering from peeling from a substrate, etc.

When the hard film of the present invention is formed on a tool, for instance, a roughing end mill, particularly made of cemented carbide or high-speed steel, it is possible to provide a hard film-coated tool having excellent adhesion, peeling resistance, hardness and wear resistance. Smoothing of a surface of the hard film-coated tool by mechanical working such as grinding, etc. effectively improves the withdrawal of chips and the suppression of the chipping of cutting edges during a cutting operation, resulting in further improvement in a cutting life.

The present invention will be specifically described below with reference to Examples without intention of restricting the scope of the present invention. The composition of the hard film in each Example and Comparative Example was analyzed by an electron probe microanalyzer with current for measuring the metal components set at 0.5 µA, and current for measuring the non-metal components set at 0.1 µA. Accordingly, a ratio of the metal components to the non-metal components was not determined. Though the metal components and the non-metal components are conveniently shown by one formula as the composition of the hard film in each Example and Comparative Example, it does not mean that a ratio of the metal components to the non-metal components is 1:1.

EXAMPLE 1

A substrate made of cemented carbide containing 13.5% by mass of Co, and an AlCrB alloy target containing 3100 ppm of oxygen were placed in a vacuum chamber, and a reaction gas comprising $N_2$ and $C_2H_2$ were introduced into the vacuum chamber with the total pressure in the chamber set at 3.0 Pa. With a bias voltage of –100 V and a substrate temperature of 450° C., a hard film of $(Al_{0.6}Cr_{0.4})(N_{0.80}C_{0.08}O_{0.10}B_{0.02})$ having a thickness of about 5 µm was formed on the substrate. The composition of the hard film was measured by an electron probe X-ray microanalysis and an Auger electron spectroscopy.

Figure 2:
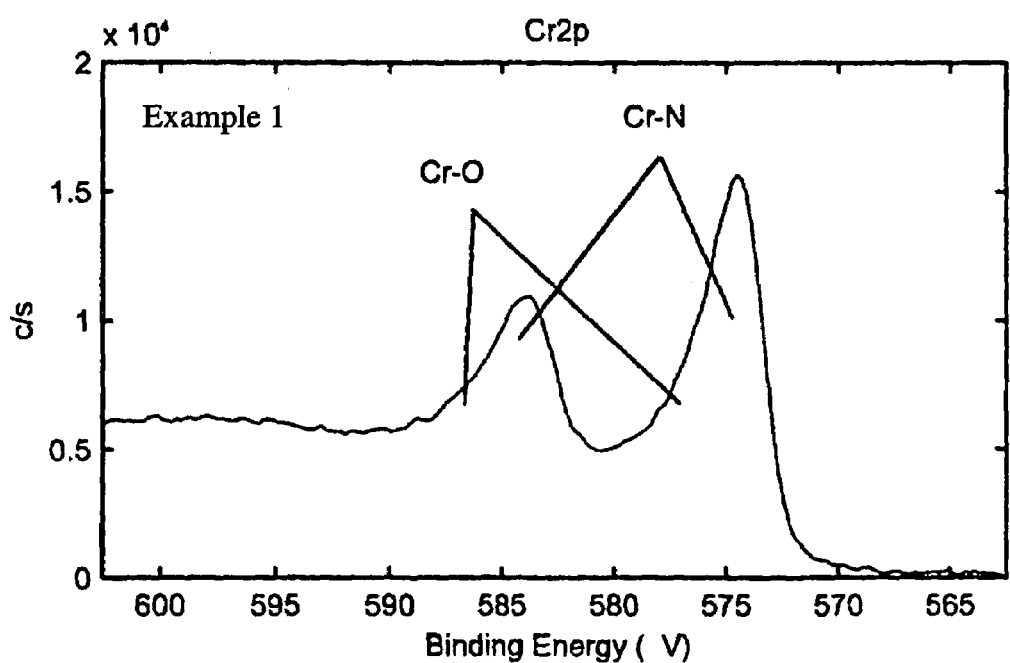
FIG. 2 is a graph showing the binding energy of Cr—N and Cr—O in Example 1.
Figure 3:
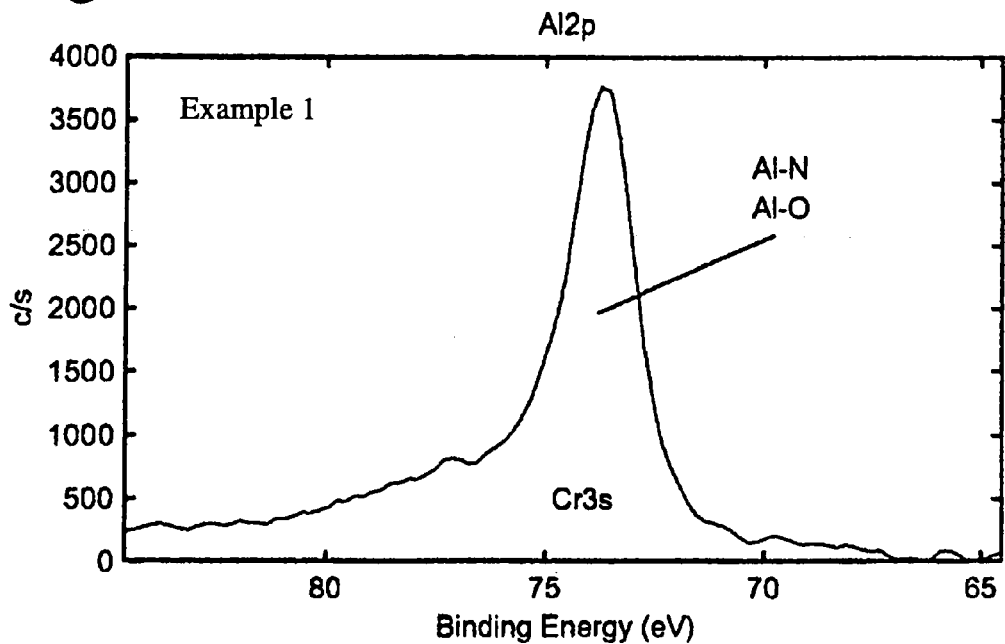
FIG. 3 is a graph showing the binding energy of Al—N and Al—O in Example 1.
Figure 4:
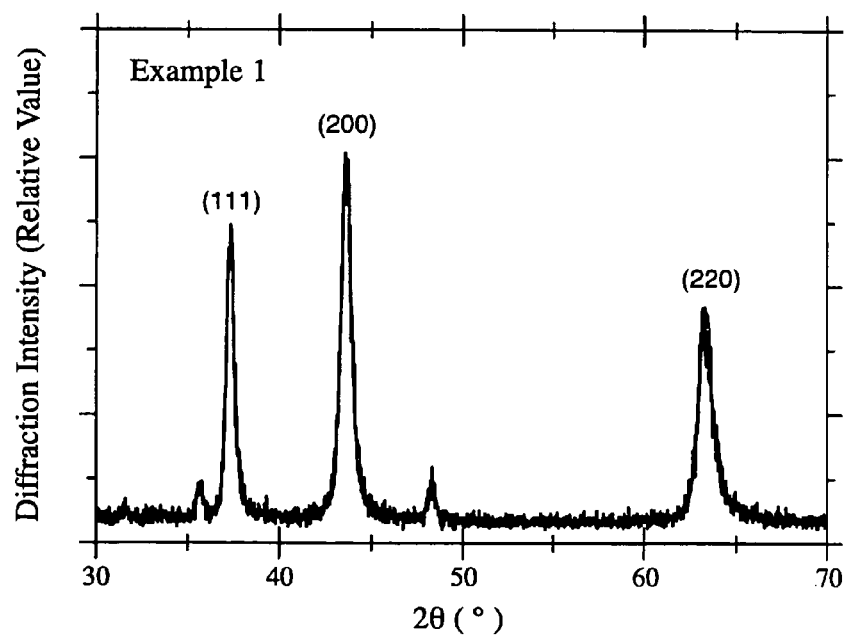
FIG. 4 is a graph showing the X-ray diffraction in Example 1.

Using an X-ray photoelectron spectroscope of a 1600S type available from PHI, the X-ray photoelectron spectroscopic analysis of the hard film was carried out. The results are shown in FIGS. 1–3. FIG. 1 shows that there was a metal-oxygen binding energy at around 530 eV, FIG. 2 shows the existence of bonds of Cr—N and Cr—O, and FIG. 3 shows the existence of bonds of Al—N and Al—O. The X-ray diffraction pattern shown in FIG. 4 indicates that the hard film is most oriented in a (200) face.

EXAMPLES 2–4, COMPARATIVE EXAMPLES 1–6

Hard films having compositions represented by $(Al_xCr_{1-x})(N_{0.95}O_{0.05})$ were formed in the same manner as in Example 1. x was 0.2 in Comparative Example 1, 0.3 in Comparative Example 2, 0.5 in Example 2, 0.6 in Example 3, 0.7 in Example 4, and 0.8 in Comparative Example 3. Hard films having compositions represented by $(Al_xCr_{1-x})N$ were also formed in the same manner. x was 0.2 in Comparative Example 4, 0.5 in Comparative Example 5, and 0.7 in Comparative Example 6.

Figure 5:
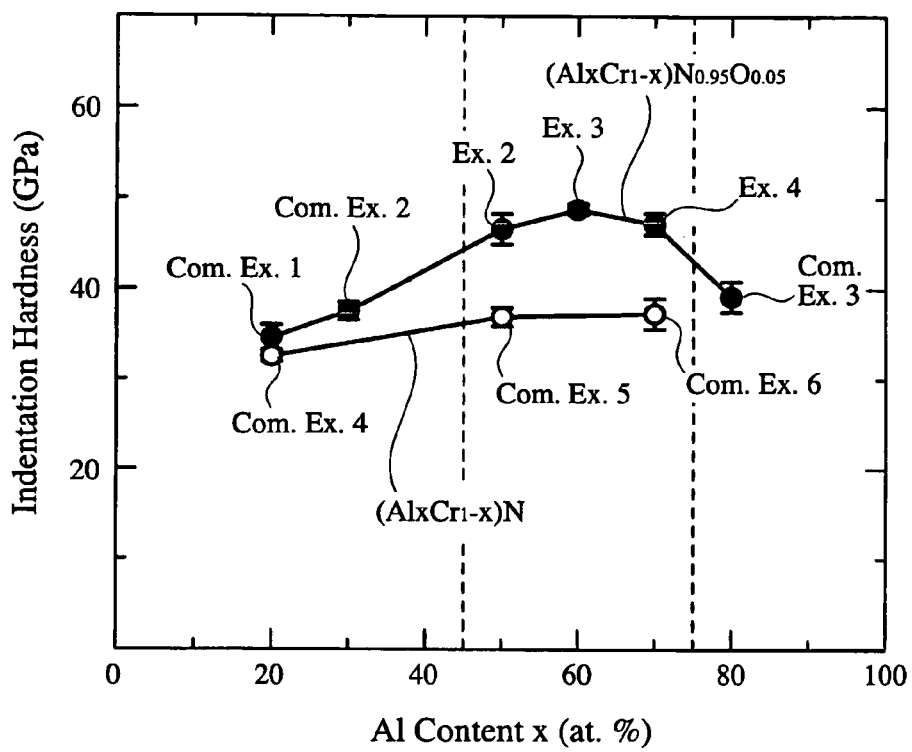
FIG. 5 is a graph showing the relation between the amount of Al and hardness in the AlCrNO film and the AlCrN film.

Using a micro-indentation hardness tester equipped with a triangular-pyramidal diamond indenter having a width tip angle of 115°, the indentation hardness of each hard film was measured under the conditions of the maximum load of 49 mN and a loading step of 4.9 mN/sec, with the maximum load kept for 1 second. The results are shown in FIG. 5. The indentation hardness shown in FIG. 5 is an average value of 10 measured values. FIG. 5 reveals that the hard films of Examples 2–4 having an Al content in a range of 45–75 atomic % had as high hardness as more than 40 GPa. The preferred hardness of the hard film of the present invention is 45–52 GPa. The hard films of Examples 2–4 were excellent in adhesion to a substrate and wear resistance.

EXAMPLES 5–9, COMPARATIVE EXAMPLES 7–9

Hard films having compositions shown in Table 1 were formed on substrates of cemented carbide, high-speed steel and die steel in the same manner as in Example 1. Table 1 also shows the oxide layer thickness, indentation hardness, residual compression stress and elastic recovery ratio of each hard film. The thickness of the oxide layer was measured after keeping each hard film at 1100° C. for 1 hour and 9 hours, respectively, in the air. The indentation hardness was measured in the same manner as in Example 2. The residual compression stress was calculated from the deformation of a thin plate. The elastic recovery ratio was determined by a nano-indentation method.

TABLE 1

| No. | Film Composition (atomic ratio) | Thickness (µm) of Oxide Layer after Kept at 1100° C. for | | Indentation Hardness (GPa) |
|---|---|---|---|---|
| | | 1 hr. | 9 hrs. | |
| Example 5 | $(Al_{0.6}Cr_{0.4})(N_{0.95}O_{0.05})$ | 0.1 | 0.6 | 48.8 |
| Example 6 | $(Al_{0.6}Cr_{0.4})(N_{0.92}O_{0.08})$ | 0.1 | 0.4 | 49.4 |
| Example 7 | $(Al_{0.5}Cr_{0.4})(N_{0.90}O_{0.05}C_{0.05})$ | 0.2 | 1.1 | 48.3 |
| Example 8 | $(Al_{0.6}Cr_{0.4})(N_{0.93}O_{0.05}B_{0.02})$ | 0.1 | 0.3 | 49.8 |

TABLE 1-continued

| Example 9 | $(Al_{0.6}Cr_{0.4})(N_{0.87}O_{0.10}B_{0.03})$ | 0.2 | 1.4 | 50.3 |
| Comparative Example 7 | $(Al_{0.2}Cr_{0.8})(N_{0.95}O_{0.05})$ | 2.4 | 3.4 | 34.6 |
| Comparative Example 8 | $(Al_{0.8}Cr_{0.2})(N_{0.95}O_{0.05})$ | 0.1 | 0.7 | 39.2 |
| Comparative Example 9 | $(Al_{0.6}Cr_{0.4})(N_{0.45}O_{0.55})$ | 1.8 | 3.9 | 38.8 |
| Comparative Example 5 | $(Al_{0.5}Cr_{0.5})N$ | 2.9 | >5.0 | 36.9 |

| | | | Peeling of Hard Film | | |
| No. | Residual Compression Stress (GPa) | Elastic Recovery Ratio (%) | Cemented Carbide[1] | High-Speed Steel[2] | Die Steel[3] |
| --- | --- | --- | --- | --- | --- |
| Example 5 | −2.2 | 34.5 | no | no | no |
| Example 6 | −2.2 | 34.1 | no | no | no |
| Example 7 | −2.3 | 34.8 | no | no | no |
| Example 8 | −1.9 | 35.2 | no | no | no |
| Example 9 | −2.3 | 35.7 | no | no | no |
| Comparative Example 7 | −2.9 | 27.6 | no | no | no |
| Comparative Example 8 | −3.7 | 30.0 | yes | yes | yes |
| Comparative Example 9 | −2.7 | 30.9 | no | yes | yes |
| Comparative Example 5 | −2.6 | 31.8 | yes | yes | yes |

Note:
[1]Containing 13.5% by mass of Co.
[2]Formed from high-speed steel powder containing 8% by mass of Co.
[3]SKD61.

It was confirmed from the data of the thickness of the oxide layer that the hard films of Examples 5–9 were substantially not oxidized, excellent in a high-temperature oxidation resistance. On the contrary, the hard film of Comparative Example 5 was extremely oxidized, and the diffusion of oxygen reached the substrate. The hard films of Examples 5–9 were higher in indentation hardness and lower in residual stress than those of Comparative Examples 5, 7–9.

Figure 6:
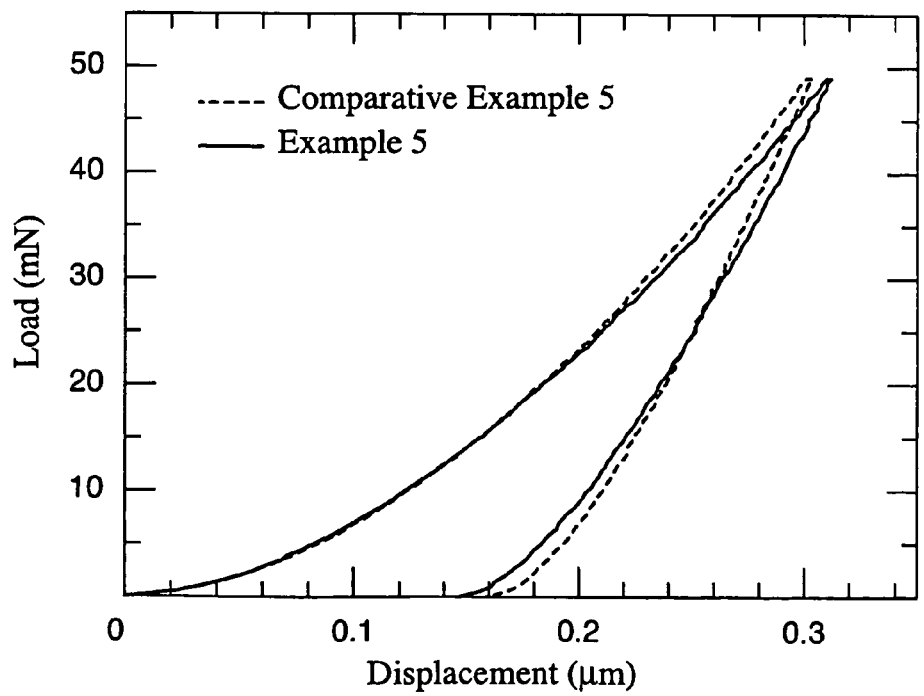
FIG. 6 is a graph showing the relation between displacement and load in Example 5 and Comparative Example 5.

It is clear from a load-displacement curve shown in FIG. 6 that the hard film of Example 5 was large in the maximum displacement and small in plastic deformation at the maximum load, meaning that there is large elastic recovery when the same stress is applied to the hard film. An elastic recovery ratio E was determined from this load-displacement curve. It is clear from Table 1 that the hard films of Examples 5–9 are excellent in elastic recovery characteristics. The hard films of Examples 5–9 having excellent elastic recovery characteristics had decreased peeling and cracking and thus excellent adhesion to the substrate.

Using a Rockwell hardness meter, each hard film was given a dent at a load of 150 N, to observe the peeling of the film by an optical microscope. The results are shown in Table 1. The hard films of Examples 5–9 were free from peeling, proving excellent adhesion. This is due to the fact that the hard films of Examples had proper elastic recovery ratios E. On the other hand, each hard film of Comparative Examples 5 and 7–9 having a low elastic recovery ratio E failed to follow the deformation of the substrate, resulting in peeling in a portion near the dent.

EXAMPLE 10, COMPARATIVE EXAMPLE 10

Using an AlCrSi alloy target having an oxygen content of 3300 ppm produced by a powder metallurgy method to have a targeted composition, and introducing an active gas comprising a nitrogen gas, an oxygen gas and, if necessary, an acetylene gas into a vacuum chamber with the total gas pressure set at 3.0 Pa, a hard film of Example 10 of $(Al_{0.60}Cr_{0.36}Si_{0.04})(N_{0.8}C_{0.1}O_{0.1})$ having a thickness of about 5 μm was formed on a mirror-polished substrate formed by fine cemented carbide particles containing 13.5% by mass of Co, at a bias voltage of −100 V and at a film-forming temperature of 450° C. by an arc-discharge ion-plating method. Also, using the same target as in Example 10 except that its oxygen content was 1800 ppm, a hard film of Comparative Example 10 was formed under the same film-forming conditions as in Example 10.

After the surface of each hard film was etched by an Ar ion gun for 5 minutes to remove contaminations from each hard film surface, X-ray photoelectron spectroscopic analysis was conducted to obtain a wide spectrum for each hard film. And after etching for 30 seconds, X-ray photoelectron spectroscopic analysis was conducted to obtain a narrow spectrum for each hard film. X-ray photoelectron spectroscopic analysis was carried out in a circular region having a diameter of 0.4 mm in each hard film at 400 W by an X-ray photoelectron spectroscope of a 1600S type available from PHI using MgKα as an X-ray source. An etching rate by the Ar ion gun was 1.9 nm/minute as converted to $SiO_2$. The composition of the resultant hard film was determined by an electron probe X-ray microanalysis and an Auger electron spectroscopy.

Figure 7:
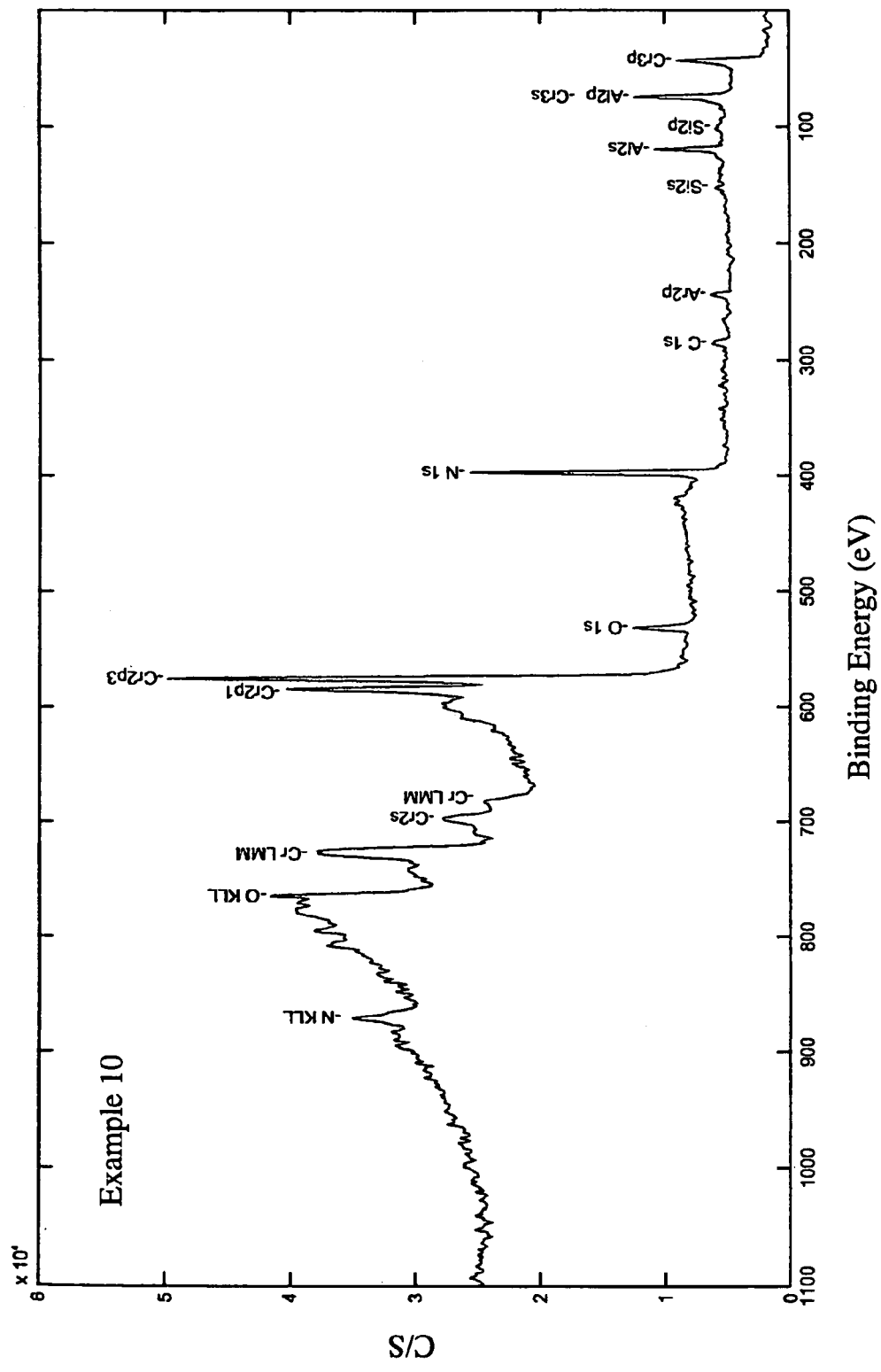
FIG. 7 is a graph showing a wide spectrum profile of the X-ray photoelectron spectroscopy in Example 10.
Figure 8:
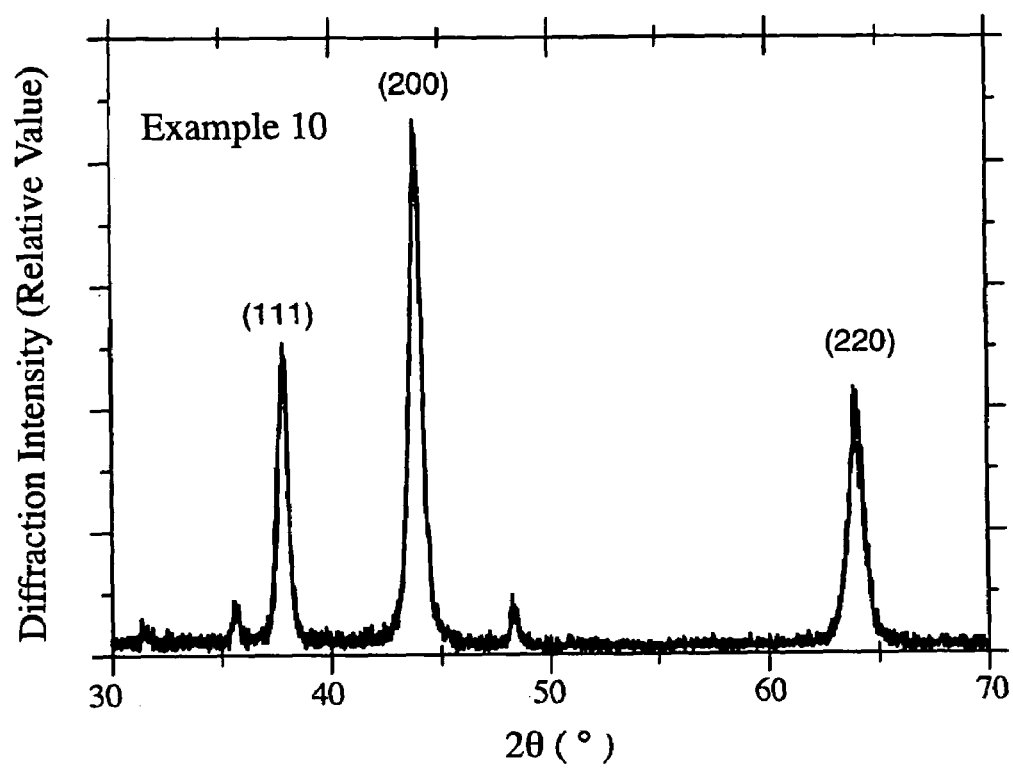
FIG. 8 is a graph showing the X-ray diffraction in Example 10.

The wide spectrum of the hard film of Example 10 is shown in FIG. 7. FIG. 7 indicates the existence of Si and O and the binding energy of Si—O in the hard film of Example 10. It is also clear from an X-ray diffraction pattern shown in FIG. 8 that the hard film of Example 10 has crystal structure oriented most in a (200) face. On the other hand, there was no peak indicating the bonding of oxygen at around 530 eV in the hard film of Comparative Example 10.

EXAMPLES 11–16, COMPARATIVE EXAMPLES 11 AND 12

Using targets (oxygen content: 3300 ppm) having metal compositions for the targeted film composition, and mirror-polished substrates formed from fine cemented carbide particles containing 13.5% by mass of Co, hard films having compositions shown in Table 2 were formed by an arc-discharge ion-plating method under the film-forming conditions shown in Table 2. The intensity of Si—N, Si—O and Si in each hard film was determined by X-ray photoelectron spectroscopy. The results are shown in Table 2.

TABLE 2

| | | Film-Forming Conditions | | |
| No. | Film Composition (atomic ratio) | Bias Voltage (V) | Gas Pressure (Pa) | Substrate Temperature (° C.) |
| --- | --- | --- | --- | --- |
| Example 11 | $(Al_{0.6}Cr_{0.35}Si_{0.05})(N_{0.85}O_{0.09}C_{0.06})$ | −100 | 2.0 | 500 |
| Example 12 | $(Al_{0.6}Cr_{0.35}Si_{0.05})(N_{0.85}O_{0.09}C_{0.06})$ | −100 | 5.0 | 500 |
| Example 13 | $(Al_{0.6}Cr_{0.36}Si_{0.04})(N_{0.85}O_{0.09}C_{0.06})$ | −200 | 5.0 | 500 |
| Example 14 | $(Al_{0.6}Cr_{0.36}Si_{0.04})(N_{0.85}O_{0.09}C_{0.06})$ | −300 | 5.0 | 500 |
| Example 15 | $(Al_{0.6}Cr_{0.35}Si_{0.05})(N_{0.85}O_{0.09}C_{0.06})$ | −200 | 5.0 | 350 |
| Example 16 | $(Al_{0.5}Cr_{0.35}Si_{0.15})(N_{0.85}O_{0.11}C_{0.04})$ | −100 | 5.0 | 500 |

TABLE 2-continued

| | | Film-Forming Conditions | | |
|---|---|---|---|---|
| Comparative Example 11 | $(Al_{0.6}Cr_{0.36}Si_{0.04})$ $(N_{0.85}O_{0.09}C_{0.06})$ | −200 | 5.0 | 800 |
| Comparative Example 12 | $(Al_{0.6}Cr_{0.35}Si_{0.05})$ $(N_{0.85}O_{0.09}C_{0.06})$ | −100 | 0.5 | 500 |

| | Intensity (%) | | |
|---|---|---|---|
| No. | I(Si—N) | I(Si—O) | I(Si) |
| Example 11 | 52.3 | 12.7 | 35.0 |
| Example 12 | 58.3 | 9.1 | 32.6 |
| Example 13 | 61.2 | 13.5 | 25.3 |
| Example 14 | 68.5 | 10.6 | 20.9 |
| Example 15 | 63.5 | 11.1 | 25.4 |
| Example 16 | 70.9 | 10.3 | 18.8 |
| Comparative Example 11 | 44.2 | 17.6 | 38.2 |
| Comparative Example 12 | 48.3 | 15.2 | 36.5 |

Figure 9:
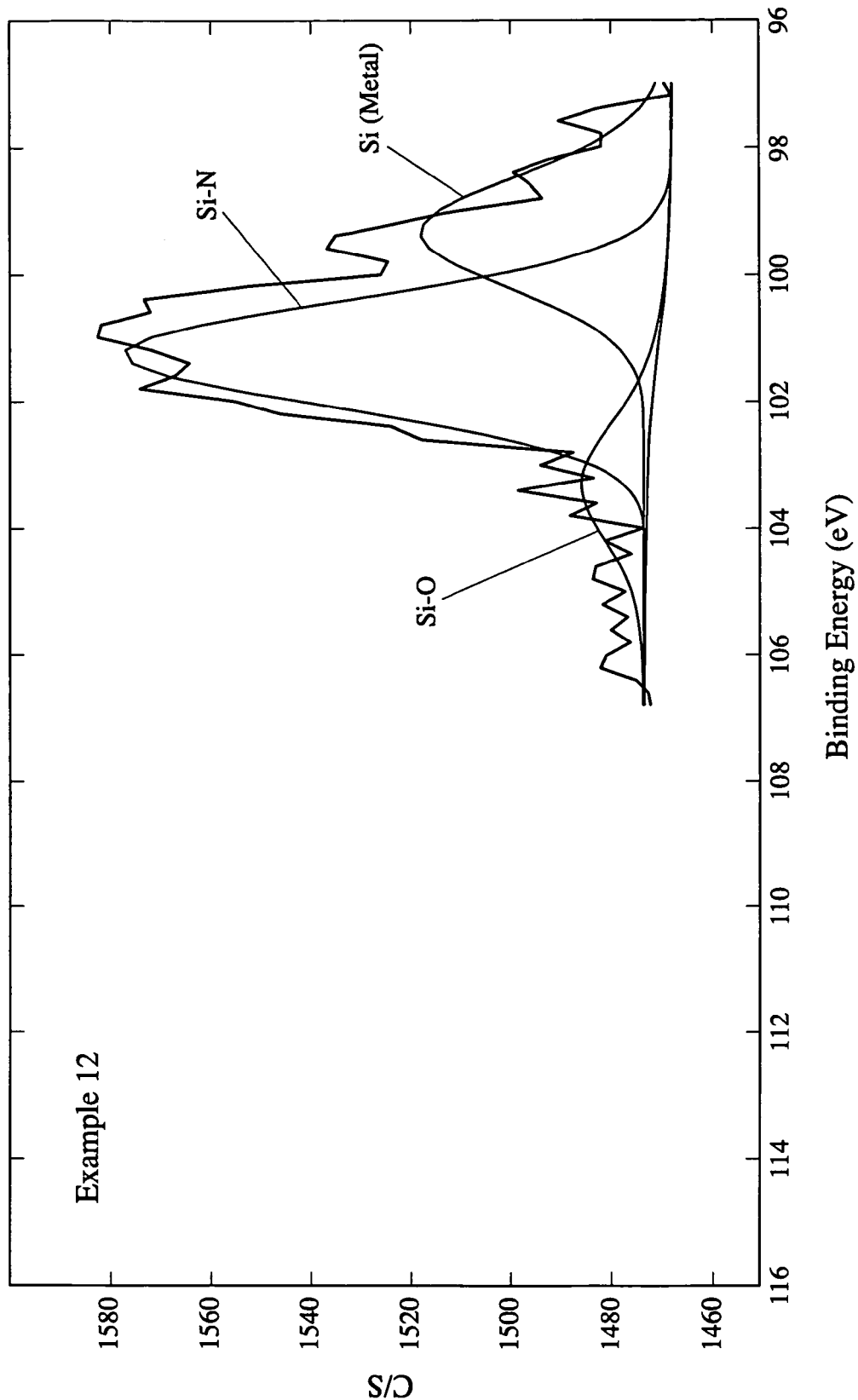
FIG. 9 is a graph showing a narrow spectrum profile of the X-ray photoelectron spectroscopy in Example 12.
Figure 10:
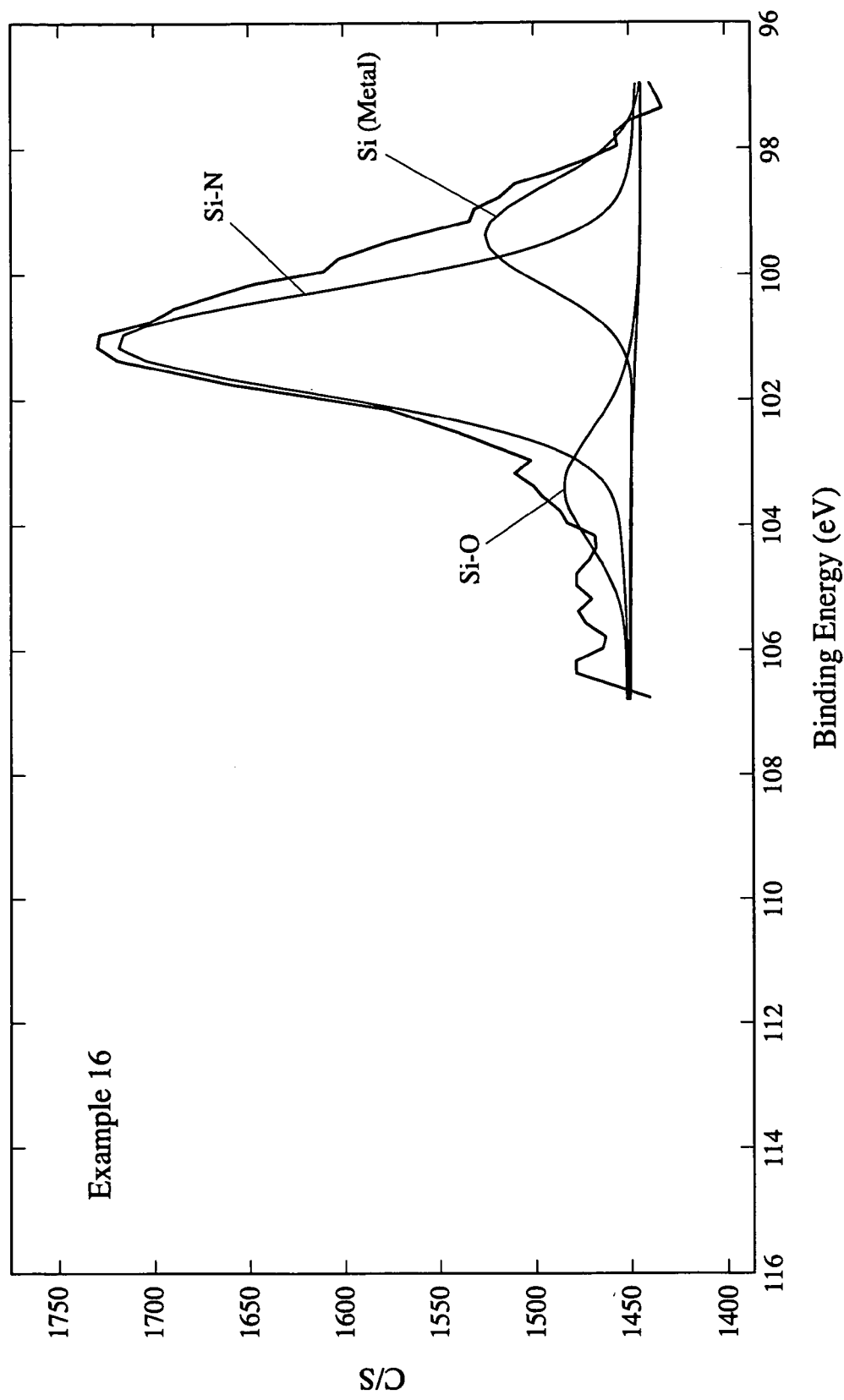
FIG. 10 is a graph showing a narrow spectrum profile of the X-ray photoelectron spectroscopy in Example 16.

Each relative intensity was calculated by peak separation in the $Si_{2p}$ spectrum of each hard film shown in Table 2, and the peak separation was carried out by a peak-fitting method, with the peak position of Si—N set at 101.2±0.2 eV, the peak position of Si—O set at 103.3±0.2 eV, and the peak position of Si (metal) set at 99.3±0.2 eV. FIG. 9 shows a narrow spectrum of $Si_{2p}$ in Example 12, and FIG. 10 shows a narrow spectrum of $Si_{2p}$ in Example 16.

It is clear from Table 2 that the preferred film-forming conditions for making I(Si—N)/[I(Si—N)+I(Si—O)+I(Si)] of 52% or more are a gas pressure of about 2.0–5.0 Pa, a bias voltage of −100 V to −300 V, and a film-forming temperature of 350° C. to 500° C. I(Si—N) changes not only by the film-forming conditions but also by the film composition.

EXAMPLES 17–21, COMPARATIVE EXAMPLES 13–15

Hard films having compositions shown in Table 3 were formed on a mirror-polished substrate of SNMN432 formed by cemented carbide containing 13.5% by mass of Co under the same film-forming conditions as in Example 10. Each hard film was kept at 1100° C. for 1 hour and 9 hours, respectively, in the air, to measure the thickness of an oxide layer on each hard film. The results are shown in Table 3 together with those of Comparative Example 5. It is clear from Table 3 that the hard films of Examples 17–21 were not drastically oxidized, proving that they were excellent in a high-temperature oxidation resistance. On the other hand, the hard film of Comparative Example 13 containing 20 atomic % of Al was much more oxidized than those of Examples 17–21, proving that the former was poorer in a high-temperature oxidation resistance.

The cross section of each of the same hard films was mirror-polished by 0.1-μm grinding diamond particles with inclination of 5°. The indentation hardness of the hard film was measured at a depth of 3.5 μm from the film surface under the following conditions. Namely, using a micro-indentation hardness tester equipped with a Berkovich-type triangular-pyramidal diamond indenter having a width tip angle of 115°, the indentation hardness of each hard film was measured under the conditions of the maximum load of 49 mN and a loading step of 4.9 mN/sec, with the maximum load kept for 1 second. Because a ratio (T/L) of the thickness T of the hard film to the maximum indentation depth L relative to a load is 10 or more, the hardness of the hard film per se can be measured without influence of the substrate. Table 3 shows an average value of 10 measured values.

Table 3 also shows the residual compression stress of the hard film calculated from the deformation of a thin plate.

It is clear from Table 3 that the hard films of Examples 17–21 were lower in residual stress and higher in hardness than the $Al_{0.5}Cr_{0.5}N$ film of Comparative Example 5. On the other hand, the hard film of Comparative Example 13 containing 20 atomic % of Al was lower in hardness and poorer in a high-temperature oxidation resistance than those of Examples 17–21. Though the hard film of Comparative Example 14 containing 30 atomic % of Si had an improved high-temperature oxidation resistance, it was lower in hardness and poorer in wear resistance than those of Examples 17–21. The hard film of Comparative Example 15 containing 85 atomic % of Al had low hardness and insufficient wear resistance.

Hard films having compositions shown in Table 3 were formed on ground substrates of SNMN432 formed by cemented carbide containing 13.5% by mass of Co, high-speed steel containing 8% by mass of Co, and SKD die steel, respectively, under the same film-forming conditions as in Example 10. An indenter of a Rockwell hardness meter was pressed onto each hard film under a load of 1470 N, to observe by an optical microscope whether or not there was peeling near the dent. Table 3 shows the presence and absence of peeling. It is clear from Table 3 that the hard films of Examples 17–21 do not peel from any substrates, exhibiting excellent adhesion. On the other hand, the hard film of Comparative Example 5 could not follow the deformation of the substrate, resulting in peeling in a portion near the dent.

Coated cutting tools, etc. are microscopically plastically deformed in cutting edges and their vicinities in a cutting stress direction during a cutting operation. When the cutting edges are plastically deformed, peeling and cracking occur in the hard film, likely to cause irregular wear and damage to the cutting edges. Thus, the plastic deformation resistance of the hard film is important in a kinetic environment accompanied with plastic deformation. Therefore, with respect to the hard films of Examples 17–21 and Comparative Examples 13–15 produced under the same film-forming conditions as in Example 10, load-displacement curves were obtained by the same nano-indentation method as above. The elastic recovery ratio E of each hard film was determined from each load-displacement curve. The results are shown in Table 3 together with those of Comparative Example 5. It is clear from Table 3 that the hard films of Examples 17–21 had better elastic recovery characteristics than the hard films of Comparative Examples 5 and 13–15. With a high elastic recovery ratio, the peeling and cracking of the hard film are suppressed in a kinetic environment causing wear, etc., proving that the hard film has good adhesion to the substrate. Examples 17–21 reveal that the elastic recovery ratio E is more preferably 30–40%, particularly 32–40%.

Figure 11:
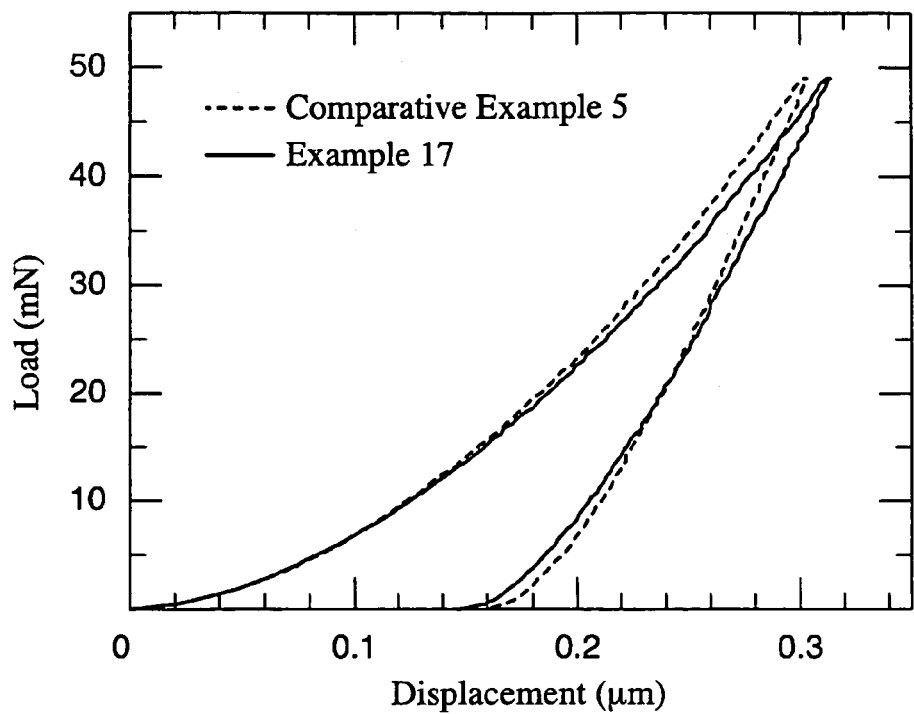
FIG. 11 is a graph showing the relation between displacement and load in Example 17 and Comparative Example 5.

FIG. 11 shows the load-displacement curves of Example 17 and Comparative Example 5. It is clear from FIG. 11 that the hard film of Example 17 is large in the maximum displacement at the maximum load, small in a plastic deformation representing a permanent strain, and large in an elastic recovery ratio when the same stress was applied.

To examine high-temperature stability, hard films having compositions shown in Table 3 were formed on the above cemented carbide substrate in the same manner as in Example 10. Each hard film was kept at room temperature, 1100° C. and 1200° C., respectively, for 4 hours in vacuum, to measure its micro-indentation hardness in the same manner as above. The results are shown in Table 3. The hard films of Examples 17–21 did not suffer from remarkable decrease in hardness in a high-temperature environment. On the other hand, the hard film of Comparative Example 5 after kept at 1100° C. for 4 hours had indentation hardness of 35.5

GPa, indicating that its hardness decreased to substantially the same level as that of a TiN film. C and Co were diffused from the substrate into the hard film after keeping at 1200° C. for 4 hours in Comparative Example 5.

than 40 GPa because of the inclusion of Si and oxygen. The more preferred hardness is 45–55 GPa. With such high hardness, the hard films have excellent wear resistance and adhesion to the substrate.

TABLE 3

| No. | Film Composition (atomic ratio) | Thickness (μm) of Oxide Layer after Kept at 1100° C. for | | Indentation Hardness (GPa) | Residual Compression Stress (GPa) |
|---|---|---|---|---|---|
| | | 1 hr. | 9 hrs. | | |
| Example 17 | $(Al_{0.6}Cr_{0.35}Si_{0.05})(N_{0.95}O_{0.05})$ | 0.1 | 0.6 | 50.7 | −2.3 |
| Example 18 | $(Al_{0.5}Cr_{0.35}Si_{0.15})(N_{0.92}O_{0.08})$ | 0.1 | 0.4 | 52.2 | −2.4 |
| Example 19 | $(Al_{0.55}Cr_{0.44}Si_{0.01})(N_{0.95}O_{0.05})$ | 0.1 | 0.8 | 49.2 | −2.4 |
| Example 20 | $(Al_{0.6}Cr_{0.35}Si_{0.05})(N_{0.93}O_{0.05}B_{0.02})$ | 0.1 | 0.3 | 50.0 | −2.6 |
| Example 21 | $(Al_{0.6}Cr_{0.35}Si_{0.05})(N_{0.80}O_{0.05}C_{0.15})$ | 0.1 | 1.4 | 51.6 | −2.4 |
| Comparative Example 13 | $(Al_{0.20}Cr_{0.75}Si_{0.05})(N_{0.95}O_{0.05})$ | 0.5 | 3.9 | 37.2 | −2.9 |
| Comparative Example 14 | $(Al_{0.20}Cr_{0.50}Si_{0.30})(N_{0.95}O_{0.05})$ | 0.1 | 1.2 | 43.2 | −3.8 |
| Comparative Example 15 | $(Al_{0.85}Cr_{0.10}Si_{0.05})(N_{0.95}O_{0.05})$ | 0.2 | 0.7 | 37.1 | −2.6 |
| Comparative Example 5 | $(Al_{0.5}Cr_{0.5})N$ | 2.9 | >5.0 | 36.9 | −2.6 |

| No. | Peeling | | | Elastic Recovery Ratio (%) | Indentation Hardness (GPa)[4] | |
|---|---|---|---|---|---|---|
| | Cemented Carbide[1] | High-Speed Steel[2] | Die Steel[3] | | 1100° C. | 1200° C. |
| Example 17 | no | no | no | 34.2 | 50.2 | 47.2 |
| Example 18 | no | no | no | 35.1 | 51.3 | 51.6 |
| Example 19 | no | no | no | 34.6 | 48.3 | 47.0 |
| Example 20 | no | no | no | 35.1 | 49.3 | 48.2 |
| Example 21 | no | no | no | 35.3 | 50.7 | 50.1 |
| Comparative Example 13 | no | no | yes | 28.6 | 36.1 | 34.5 |
| Comparative Example 14 | yes | yes | yes | 30.1 | 35.2 | 35.1 |
| Comparative Example 15 | yes | yes | yes | 30.4 | 36.2 | 35.1 |
| Comparative Example 5 | yes | yes | yes | 31.8 | 35.5 | 34.5 |

Note:
[1]Containing 13.5% by mass of Co.
[2]Produced from high-speed steel powder containing 8% by mass of Co.
[3]SKD61.
[4]After heat-treated at 1100° C. and 1200° C., respectively, for 4 hours in vacuum.

EXAMPLES 22–24, COMPARATIVE EXAMPLES 16–21

Figure 12:
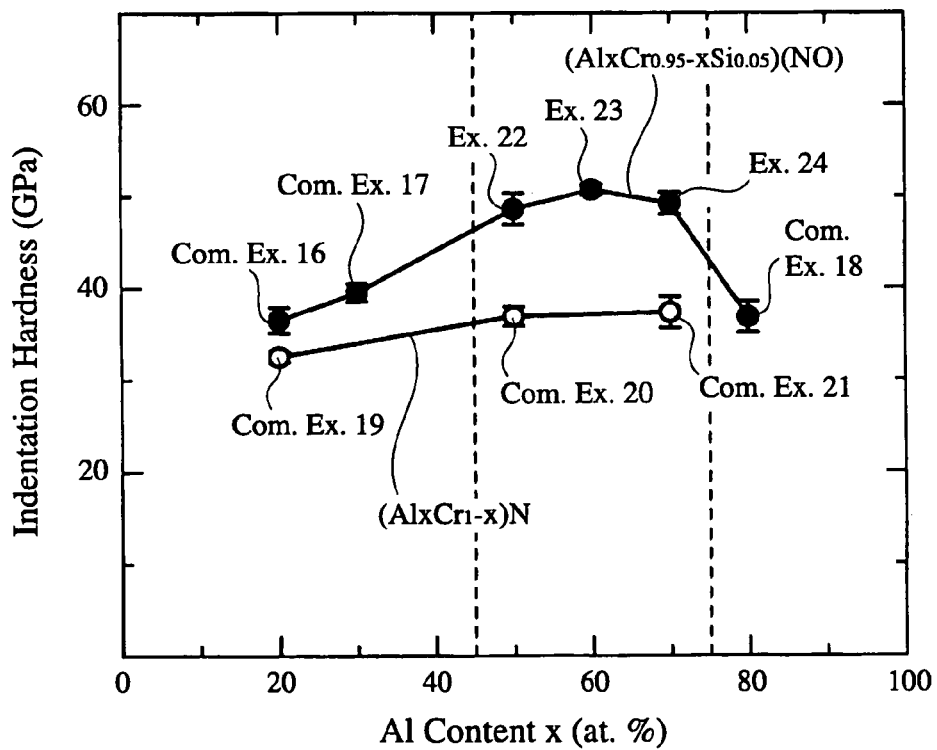
FIG. 12 is a graph showing the relation between the amount of Al and hardness in the AlCrSiNO film and the AlCrN film.

Hard films having composition represented by $(Al_xCr_{0.95-x}Si_{0.05})(NO)$ and $(Al_xCr_{1-x})N$, respectively, were formed under the same film-forming conditions as in Example 10. In the hard film of $(Al_xCr_{0.95-x}Si_{0.05})(NO)$, x was 0.2 in Comparative Example 16, 0.3 in Comparative Example 17, 0.5 in Example 22, 0.6 in Example 23, 0.7 in Example 24, and 0.8 in Comparative Example 18. In the hard film of $(Al_xCr_{1-x})N$, x was 0.2 in Comparative Example 19, 0.5 in Comparative Example 20, and 0.7 in Comparative Example 21. The indentation hardness of each hard film was measured in the same manner as in Examples 17–21. The results are shown in FIG. 12.

The hard films of Examples 22–24 having an Al content in a range of 45–75 atomic % had as high hardness as more

EXAMPLES 25–36, COMPARATIVE EXAMPLES 22–26

A degreased and washed substrate was placed in a vacuum chamber of an arc-discharge ion-plating apparatus, kept at 500° C. for 30 minutes and then irradiated with Ar ions for cleaning.

With each of an $Al_{0.7}Cr_{0.3}$ alloy target (Examples 25, 26, 29–36, Comparative Examples 22–24) and an $Al_{0.68}Cr_{0.27}Si_{0.5}$ alloy target (Examples 27, 28) both with an oxygen content of 3200 ppm placed in the vacuum chamber, an $N_2$ gas and reaction gases selected from a $CH_4$ gas, a $C_2H_2$ gas, an Ar gas, an $O_2$ gas, a CO gas and a $B_3N_3H_6$ gas depending on the object were introduced into the vacuum chamber, with the total pressure set at 7.5 Pa. With a pulse bias voltage (negative bias voltage: −120 V, positive bias voltage: +10 V, frequency: 20 kHz, and pulse width: negative pulse to positive pulse =80%: 20%), arc discharge was applied to each target to form a hard film having a thickness of about 3.5 μm on a mirror-polished substrate of SNMN432 formed by ultrafine cemented carbide particles containing 7% by mass of Co at a film-forming temperature of 450° C. The film-forming conditions of Comparative Examples were the same as in Examples unless otherwise mentioned, except that a constant negative bias voltage was applied to the substrate.

Each of the resultant hard films was analyzed by an electron probe microanalyzer with respect to composition in a region of 50 μm in diameter. The analysis results are shown in Table 4.

Figure 13:
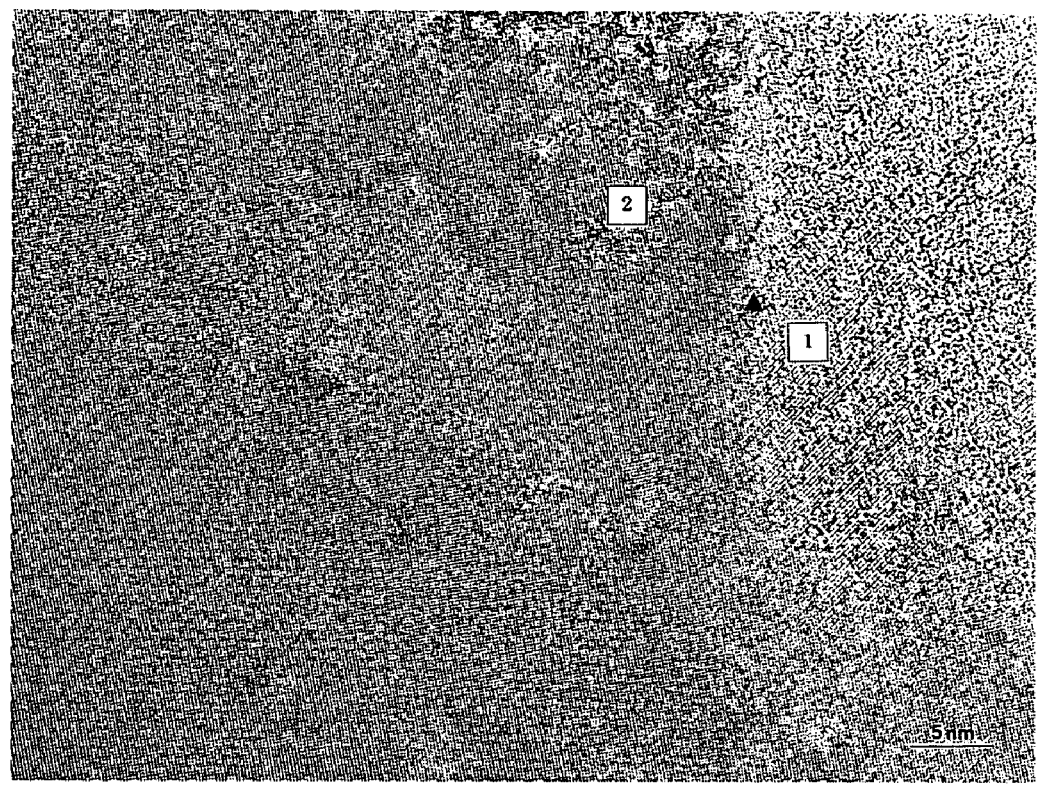
FIG. 13 is an electron field emission transmission electron micrograph showing the cross section of the hard film of Example 25.

To confirm the presence of oxygen in the hard film, the cross section structure of the hard film was observed by a field emission transmission electron microscope (TEM) of a JEM-2010F type available from JEOL. Ltd. at an acceleration voltage of 200 kV. FIG. 13 is a TEM photograph showing the cross section structure of the hard film of Example 25. In the TEM photograph of FIG. 13, crystal grains 1, 2 and boundaries were clearly observed.

Figure 14:
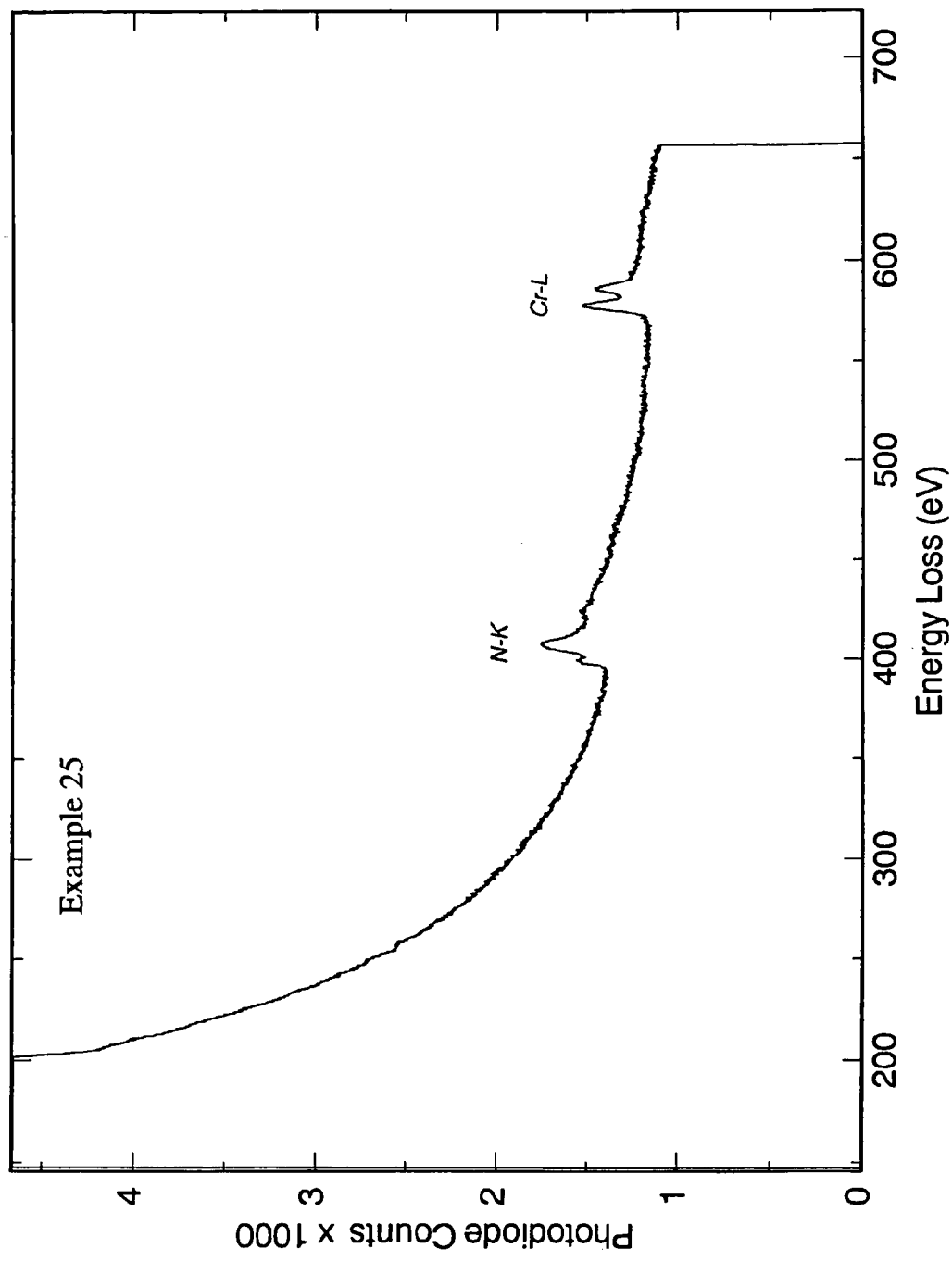
FIG. 14 is a graph showing the analysis results by electron-beam energy-loss spectroscopy in a region of the crystal grain 2 in FIG. 13.
Figure 15:
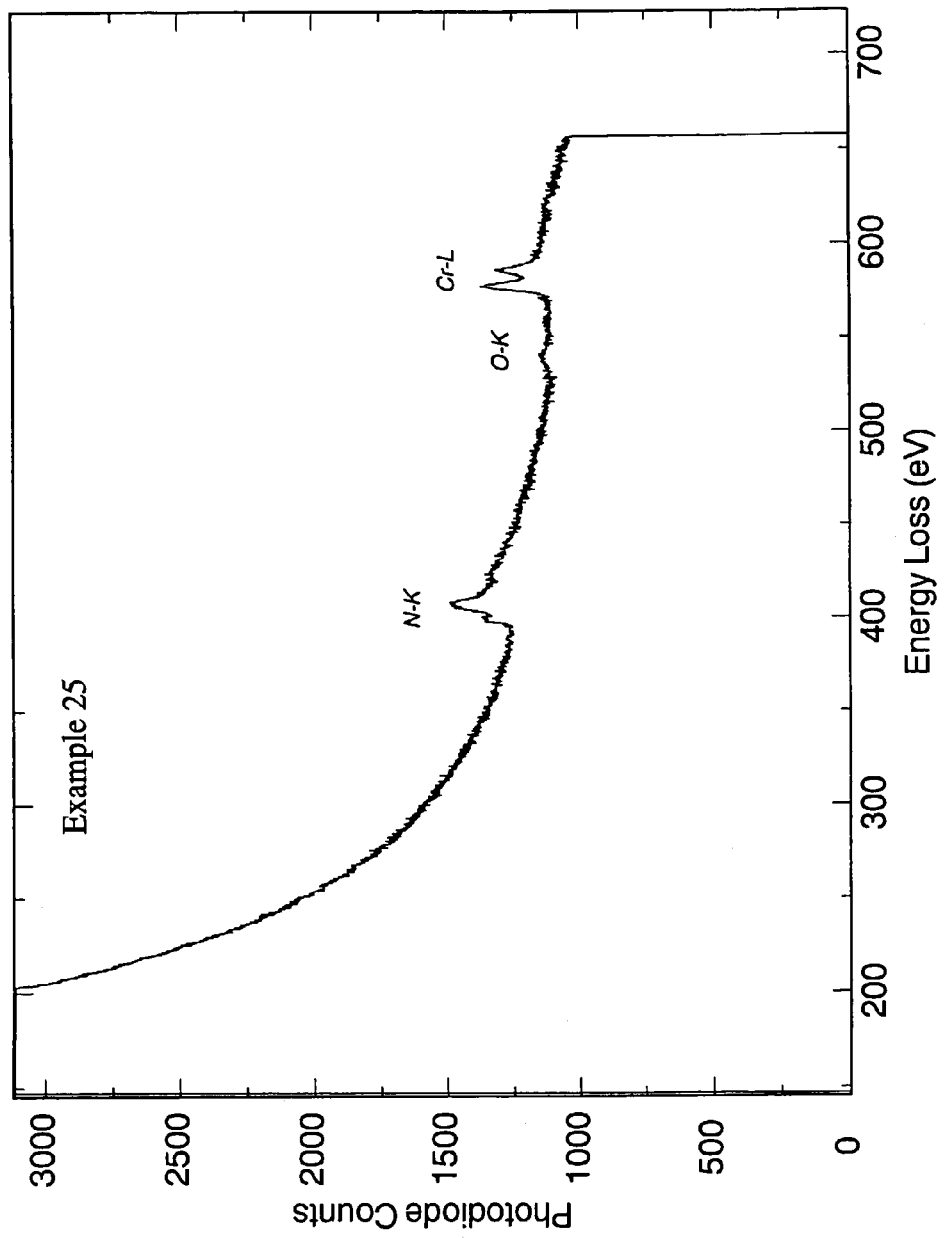
FIG. 15 is a graph showing the analysis results by electron-beam energy-loss spectroscopy in a portion shown by the arrow in the boundaries in FIG. 13.

The oxygen contents in crystal grains and grain boundaries were analyzed by an electron-beam energy-loss spectroscope of Model 766 available from Gatan. In the electron-beam energy-loss spectroscopy, an analysis region was 1 nm in diameter. FIG. 14 shows the analysis results of the crystal grain 2 in FIG. 13 in a region of 1 nm in diameter by the electron-beam energy-loss spectroscopy. FIG. 15 shows the analysis results of the boundary (shown by the arrow) in FIG. 13 in a region of 1 nm in diameter by the electron-beam energy-loss spectroscopy.

It was confirmed from FIG. 15 that there was oxygen in the grain boundaries. FIGS. 14 and 15 indicate that oxygen exists more in grain boundaries than in crystal grains in the hard film. To control such that oxygen exists more in grain boundaries than in crystal grains, the proper film-forming conditions should be selected. In addition, the use of an oxygen-containing metal target is effective.

To detect the bonding state of oxygen in the hard film of Example 25, X-ray photoelectron spectroscopic analysis was carried out at 400 W in a circular region of 0.4 mm in diameter in the film, using an X-ray photoelectron spectroscope of 1600S type available from PHI, which comprised MgKα as an X-ray source. Each test piece for analysis was sufficiently degreased and washed. With an Ar ion gun placed with inclination of 50° to a test piece surface, an X-ray generator was disposed at such a position that X-ray impinges the test piece surface at 90°, and a photoelectron detector was disposed with inclination of 35° relative to the test piece surface. A 10-mm$^2$-region of each test piece was etched with Ar ions for 120 minutes, and spectrum was measured every 24 minutes. A rate of etching with Ar ions was 1.5 nm/min on the basis of $SiO_2$.

Figure 16:
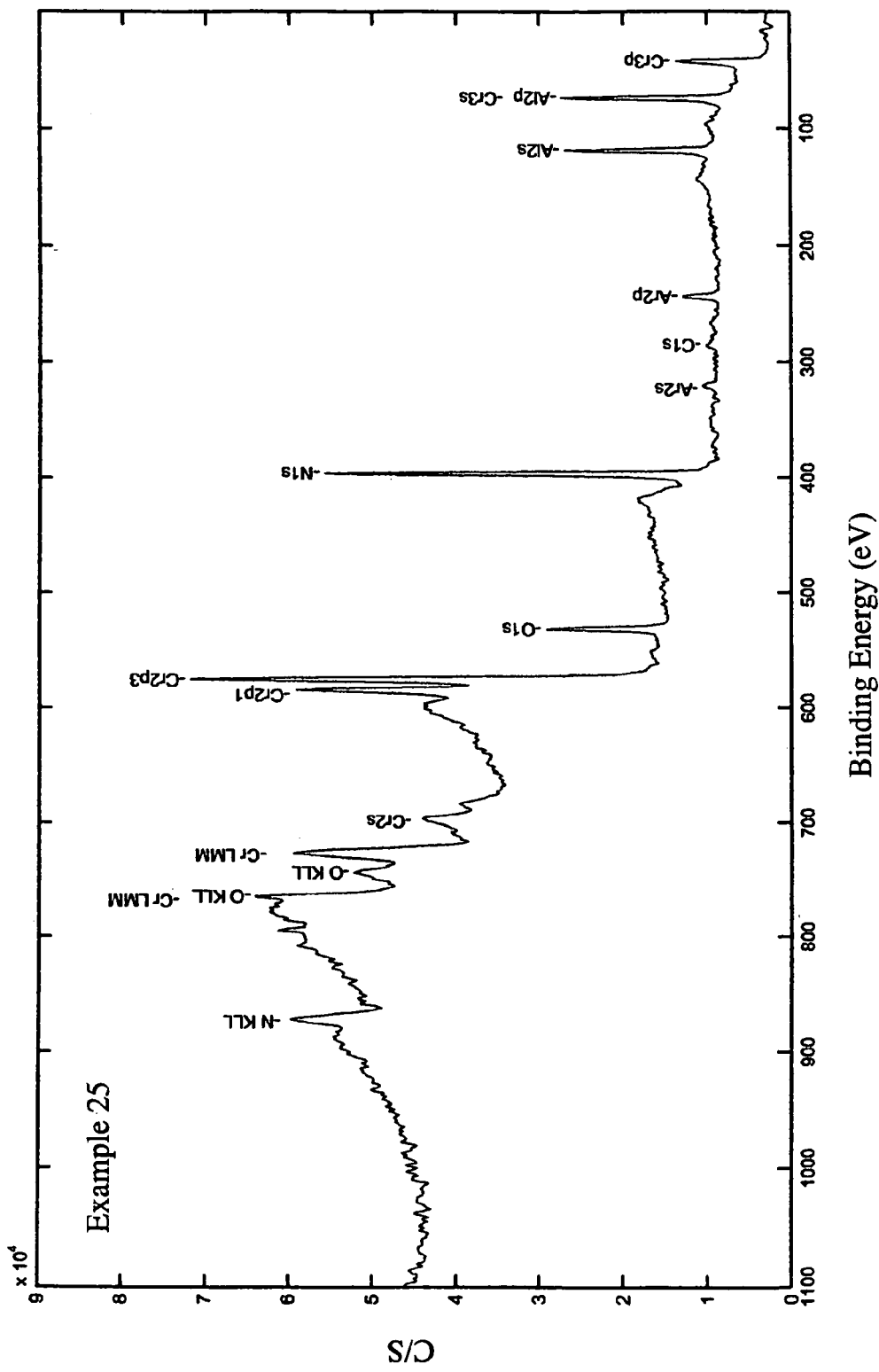
FIG. 16 is a graph showing the X-ray photoelectron spectrum of the hard film of Example 25.
Figure 17:
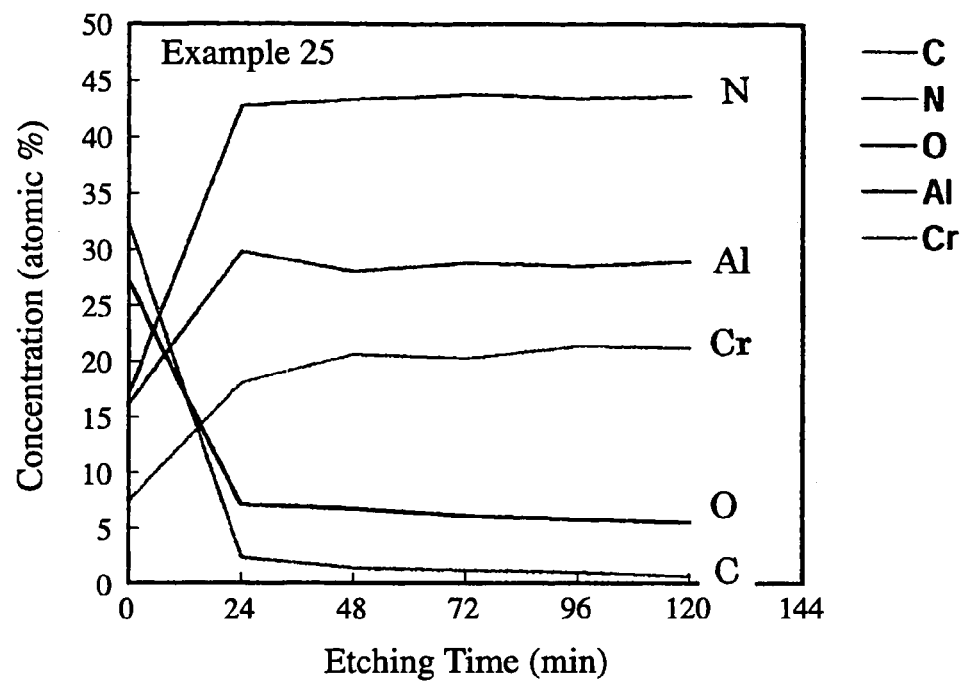
FIG. 17 is a graph showing the element analysis results of the hard film of Example 25 by X-ray photoelectron spectroscopy in a film thickness direction.
Figure 18:
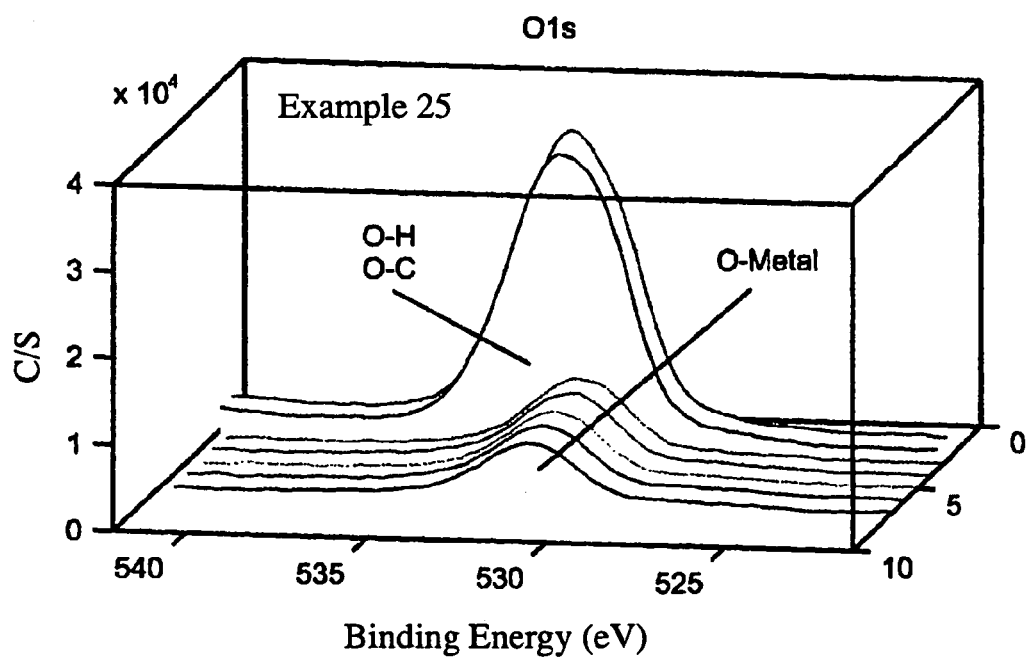
FIG. 18 is a graph showing the $O_{1s}$ spectra of X-ray photoelectron spectroscopy measured every 24 minutes in Example 25.

FIG. 16 shows the spectrum after etching with Ar ions for 120 minutes. It is clear from FIG. 16 that the hard film of Example 25 contained oxygen. FIG. 17 shows the results of element analysis conducted by X-ray photoelectron spectroscopy in a film thickness direction. It was confirmed from FIG. 17 that there was about 6 atomic % of oxygen per the total amount (100 atomic %) of non-metal elements in the hard film of Example 25. FIG. 18 shows the spectra corresponding to $O_{1s}$ measured every 24 minutes. In FIG. 18, the outermost surface of the test piece is shown on a rear end, and the deepest portion of the test piece is shown on a front end. It is clear from FIG. 18 that the hard film of Example 25 has the binding energy of metals (Al and Cr) and oxygen in a range of 525–535 eV. The bonding was mainly between carbon and oxygen on the test piece surface, while the bonding of metals and oxygen increased as going inside the film. Table 4 shows the binding energy and bonding state of oxygen to metals in a range of 525–535 eV in each hard film.

Further, the following characteristics of each hard film were evaluated.

(1) Crystallinity of Hard Film

To evaluate the crystallinity of each hard film, X-ray diffraction measurement was conducted with the incidence angle of X-ray to the test piece surface set at 5°. It was found from the resultant X-ray diffraction profile that the face index of the hard film at the maximum intensity was a (111) face or a (200) face of an NaCl-type crystal structure. Expressing the X-ray diffraction intensity of the (111) face as I(111), and the X-ray diffraction intensity of the (200) face as I(200), the half width of 2θ of the face index of each film at the maximum intensity and I(200)/I(111) are shown in Table 4.

(2) Indentation Hardness and Elastic Recovery Ratio

With each mirror-polished hard film inclined by 5°, the indentation hardness of each hard film was measured at a depth of 2–3 μm from the surface at 10 points by the same nano-indentation method as in Examples 17–21. The elastic recovery ratio E was calculated from a load-displacement curve obtained by the measurement of the indentation hardness. Table 4 shows an average value of the hardness of each film and the elastic recovery ratio E.

(3) Thickness of Oxide Layer

To evaluate the high-temperature oxidation resistance of each hard film, a test piece having each hard film was kept at 1100° C. for 9 hours in the air, and the thickness of the resultant oxide layer was measured. The results are shown in Table 4.

(4) Adhesion of Hard Film

To evaluate the adhesion of each hard film, the hardness of a test piece having each hard film was measured at 1470 N by a Rockwell hardness meter, and observation was conducted on whether or not there was peeling in a portion near the dent. The results are shown in Table 4.

(5) Wear Resistance

Each hard film was formed on a four-edge roughing end mill made of high-speed steel having an outer diameter of 12 mm, to measure cutting length until the average wear width of a flank reached 0.25 mm, or when the tool was broken, thereby evaluating the wear resistance of the hard film. The results are shown in Table 4. The cutting conditions were as follows:

| | |
|---|---|
| Cutting method: | Rough working on side surface, |
| Work: | SCM440 (HRC 31), |
| Depth of cutting: | 6 mm in a radial direction and 12 mm in an axial direction, |
| Cutting speed: | 70 m/min, |
| Feed: | 0.07 mm/edge, and |
| Cutting oil: | None (dry type using air blow). |

TABLE 4

| No. | Film Composition (atomic ratio) | Face Index at Maximum Intensity | Half Width of 2θ in Face Index at Maximum Intensity(°) | Oxygen Concentration |
|---|---|---|---|---|
| Example 25 | $(Al_{0.65}Cr_{0.35})(N_{0.96}O_{0.03}C_{0.01})$ | (111) | 0.7 | Boundaries > Crystal Grains |
| Example 26 | $(Al_{0.65}Cr_{0.35})(N_{0.96}O_{0.03}C_{0.01})$ | (111) | 0.9 | Boundaries > Crystal Grains |
| Example 27 | $(Al_{0.65}Cr_{0.31}Si_{0.04})(N_{0.95}O_{0.05})$ | (200) | 0.8 | Boundaries > Crystal Grains |

TABLE 4-continued

| | | | | | |
|---|---|---|---|---|---|
| Example 28 | $(Al_{0.65}Cr_{0.31}Si_{0.04})$ $(N_{0.95}O_{0.05})$ | (200) | 1.2 | Boundaries > Crystal Grains | |
| Example 29 | $(Al_{0.65}Cr_{0.35})$ $(N_{0.97}O_{0.03})$ | (111) | 1.1 | Boundaries > Crystal Grains | |
| Example 30 | $(Al_{0.65}Cr_{0.35})$ $(N_{0.99}O_{0.01})$ | (111) | 1.2 | Boundaries > Crystal Grains | |
| Example 31 | $(Al_{0.65}Cr_{0.35})$ $(N_{0.92}O_{0.03}B_{0.05})$ | (200) | 0.9 | Boundaries > Crystal Grains | |
| Example 32 | $(Al_{0.65}Cr_{0.35})$ $(N_{0.99}O_{0.01})$ | (111) | 0.7 | Boundaries > Crystal Grains | |
| Example 33 | $(Al_{0.65}Cr_{0.35})$ $(N_{0.99}O_{0.01})$ | (111) | 0.8 | Boundaries > Crystal Grains | |
| Example 34 | $(Al_{0.65}Cr_{0.35})$ $(N_{0.99}O_{0.01})$ | (111) | 0.8 | Boundaries > Crystal Grains | |
| Example 35 | $(Al_{0.65}Cr_{0.35})$ $(N_{0.99}O_{0.01})$ | (111) | 0.7 | Boundaries > Crystal Grains | |
| Example 36 | $(Al_{0.65}Cr_{0.35})$ $(N_{0.99}O_{0.01})$ | (111) | 1.3 | Boundaries > Crystal Grains | |
| Comparative Example 22 | $(Al_{0.65}Cr_{0.35})$ $(N_{0.97}O_{0.02}C_{0.01})$ | (111) | 0.9 | Boundaries = Crystal Grains | |
| Comparative Example 23 | $(Al_{0.65}Cr_{0.35})$ $(N_{0.98}O_{0.01}C_{0.01})$ | (111) | 0.3 | Boundaries ≦ Crystal Grains | |
| Comparative Example 24 | $(Al_{0.65}Cr_{0.35})$ $(N_{0.98}O_{0.01}C_{0.01})$ | (111) | 2.1 | Boundaries ≦ Crystal Grains | |
| Comparative Example 25 | $(Al_{0.50}Ti_{0.50})N$ | (200) | 0.4 | Boundaries = Crystal Grains | |
| Comparative Example 26 | $(Al_{0.50}Cr_{0.50})N$ | (111) | 0.7 | Boundaries = Crystal Grains | |

| No. | Oxygen Bonding[1] | Peak of Oxygen Concentration[2] | I(200)/I(111) |
|---|---|---|---|
| Example 25 | Al—O, Cr—O | yes | 0.8 |
| Example 26 | Al—O, Cr—O | yes | 0.8 |
| Example 27 | Al—O, Cr—O, Si—O | yes | 1.8 |
| Example 28 | Al—O, Cr—O, Si—O | yes | 2.2 |
| Example 29 | Al—O, Cr—O | yes | 0.8 |
| Example 30 | Al—O, Cr—O | yes | 0.9 |
| Example 31 | Al—O, Cr—O | yes | 1.4 |
| Example 32 | — | no | 0.7 |
| Example 33 | Al—O, Cr—O | yes | 15 |
| Example 34 | Al—O, Cr—O | yes | 0.9 |
| Example 35 | Al—O, Cr—O | yes | 0.8 |
| Example 36 | Al—O, Cr—O | yes | 0.4 |
| Comparative Example 22 | Al—O, Cr—O | yes | 0.6 |
| Comparative Example 23 | Al—O, Cr—O | yes | 0.4 |
| Comparative Example 24 | Al—O, Cr—O | yes | 0.9 |
| Comparative Example 25 | — | no | 12 |
| Comparative Example 26 | — | no | 0.9 |

Note:
[1] Oxygen bonding in a range of 525–535 eV.
[2] The peak of the oxygen concentration in a region 500 nm deep from a surface.

| No. | E(%) | Hardness (GPa) | Thickness of Oxide Layer (μm) | Peeling | Cutting Length (m) |
|---|---|---|---|---|---|
| Example 25 | 31 | 48 | 0.6 | no | 63 |
| Example 26 | 32 | 49 | 0.6 | no | 62 |
| Example 27 | 33 | 52 | 0.3 | no | 74 |
| Example 28 | 34 | 53 | 0.3 | no | 78 |
| Example 29 | 31 | 49 | 0.5 | no | 61 |
| Example 30 | 32 | 47 | 0.6 | no | 61 |
| Example 31 | 33 | 51 | 0.2 | no | 72 |
| Example 32 | 30 | 44 | 0.7 | no | 36 |
| Example 33 | 30 | 43 | 0.9 | no | 43 |
| Example 34 | 27 | 42 | 0.9 | no | 45 |
| Example 35[1] | 31 | 48 | 0.2 | no | 79 |
| Example 36[2] | 28 | 42 | 0.7 | no | 45 |
| Comparative Example 22[3] | 29 | 36 | 1.5 | yes | 23 |
| Comparative Example 23 | 28 | 35 | 1.2 | yes | 25 |
| Comparative Example 24 | 28 | 35 | 1.2 | yes | 14 |
| Comparative Example 25 | 27 | 38 | 5 or more | yes | 20 |
| Comparative Example 26 | 27 | 36 | 5 or more | yes | 21 |

Note:
[1] The oxygen concentration was the maximum on the outermost surface.
[2] Hcp phase detected.
[3] At a reaction gas pressure of 0.3 Pa.

It was confirmed from Table 4 that the oxygen concentration was higher in grain boundaries than in crystal grains in any of Examples 25–36. Examples 25–36 provided higher hardness and better adhesion than Comparative Examples 22–26. The half width of 2θ at a face index at the maximum intensity in X-ray diffraction was in a range of 0.5–2° in Examples 25–36, while it was 0.3° in Comparative Example 23 and 2.1° in Comparative Example 24. Accordingly, the hard films of Comparative Examples 23 and 24 had low hardness and thus poor adhesion. With respect to the high-temperature oxidation resistance, oxidation proceeded slowly in Examples 25–36.

As is clear from Table 4, the hard films of Examples 25–36 had longer cutting life and better wear resistance than those of Comparative Examples 22–26. Particularly, the hard films of AlCrSiNO of Examples 27 and 28 had a long cutting life and thus excellent wear resistance.

The hard film of AlCrNOB of Example 31 had excellent wear resistance because of the inclusion of B.

Rather than Example 32, in which the bonding of oxygen was not clearly observed in a range of 525–535 eV, other Examples, in which the bonding of oxygen was clearly observed, had higher hardness, longer cutting length and better wear resistance.

Rather than Example 33, in which a ratio of I(200)/I(111) was 15, other Examples meeting the conditions of 0.3<I(200)/I(111)<12 had higher hardness, longer cutting life and better wear resistance.

Rather than Example 34, in which the elastic recovery ratio E determined by a nano-indentation method was 27, other Examples meeting the conditions of 28≦E≦42, had higher hardness, higher adhesion, longer cutting length and better wear resistance.

Example 35 having the peak of the oxygen concentration at a depth within 500 nm from the surface had an excellent high-temperature oxidation resistance and the longest cutting life.

Rather than the hard film of Example 36 having a hexagonal crystal (considered to be AlN) in addition to an NaCl-type crystal structure in X-ray diffraction, the hard films of other Examples having only an NaCl structure had higher hardness, longer cutting life and better wear resistance.

In Comparative Example 22, in which a hard film was formed at a reaction gas pressure of 0.3 Pa, there was no difference in the oxygen concentration observed between crystal grains and grain boundaries, resulting in insufficient hardness and adhesion. Accordingly, the wear resistance was not improved, and the life was short.

In Comparative Examples 23 and 24, in which the half-width of 2θ was 0.3° and 2.1°, respectively, the hardness and the adhesion were not sufficiently improved, failing to improve the wear resistance and resulting in short life.

EXAMPLES 37–53, COMPARATIVE EXAMPLES 27 AND 28

The same tools as in Examples 25–36 were coated with hard films shown in Table 5 and then with additional films shown in Table 5 in a thickness of about 1 μm, to conduct a cutting test under the same conditions as in Examples 25–36. The film composition of each tool and the maximum life are shown in Table 5.

Though the present invention has been explained in detail referring to Examples above, the present invention is not restricted thereto, and various modifications may be made within the scope of the concept of the present invention. For instance, part of the metal components (less than 4 atomic %) may be replaced by one or more metals in 4a, 5aand 6a groups in the hard film.

As described above in detail, with oxygen or oxygen and Si added to the hard film of AlCrN, the hard film can be provided with improved hardness, adhesion, wear resistance and high-temperature oxidation resistance. When such hard films are formed on cutting tools and wear-resistant tools such as end mills, drills, etc., the cutting life can be extremely improved. With these improvements, the production cost of members requiring the above characteristics is drastically reduced.

TABLE 5

| No. | Composition (atomic ratio) | | Cutting Length (m) |
|---|---|---|---|
| | Hard Film | Additional Film | |
| Example 37 | $(Al_{0.65}Cr_{0.35})(N_{0.97}O_{0.03})$ | $(Al_{0.75}Si_{0.25})(N_{0.97}O_{0.03})$ | 72 |
| Example 38 | $(Al_{0.65}Cr_{0.35})(N_{0.97}O_{0.03})$ | $(Cr_{0.97}Si_{0.03})(N_{0.97}B_{0.03})$ | 75 |
| Example 39 | $(Al_{0.65}Cr_{0.35})(N_{0.97}O_{0.03})$ | $(Ti_{0.78}Si_{0.22})N$ | 89 |
| Example 40 | $(Al_{0.65}Cr_{0.35})(N_{0.97}O_{0.03})$ | Hard Carbon | 82 |
| Example 41 | $(Al_{0.65}Cr_{0.35})(N_{0.97}O_{0.03})$ | Boron Nitride | 91 |
| Example 42 | $(Al_{0.65}Cr_{0.35})(N_{0.97}O_{0.03})$ | $Ti(N_{0.97}B_{0.03})$ | 93 |
| Example 43 | $(Al_{0.65}Cr_{0.35})(N_{0.92}O_{0.03}B_{0.05})$ | $Ti(N_{0.88}B_{0.12})$ | 95 |
| Example 44 | $(Al_{0.65}Cr_{0.31}Si_{0.04})(N_{0.95}O_{0.05})$ | $(Al_{0.75}Si_{0.25})(N_{0.97}O_{0.03})$ | 82 |
| Example 45 | $(Al_{0.65}Cr_{0.31}Si_{0.04})(N_{0.95}O_{0.05})$ | $(Cr_{0.97}Si_{0.03})(N_{0.97}B_{0.03})$ | 86 |
| Example 46 | $(Al_{0.65}Cr_{0.31}Si_{0.04})(N_{0.95}O_{0.05})$ | $(Ti_{0.78}Si_{0.22})N$ | 98 |
| Example 47 | $(Al_{0.65}Cr_{0.31}Si_{0.04})(N_{0.95}O_{0.05})$ | Hard Carbon | 102 |
| Example 48 | $(Al_{0.65}Cr_{0.31}Si_{0.04})(N_{0.95}O_{0.05})$ | Boron Nitride | 111 |
| Example 49 | $(Al_{0.65}Cr_{0.31}Si_{0.04})(N_{0.95}O_{0.05})$ | $Ti(N_{0.97}B_{0.03})$ | 104 |
| Example 50 | $(Al_{0.65}Cr_{0.31}Si_{0.04})(N_{0.95}O_{0.05})$ | $Ti(N_{0.88}B_{0.12})$ | 107 |
| Example 51[1] | $(Al_{0.65}Cr_{0.31}Si_{0.04})(N_{0.95}O_{0.05})$ | $(Cr_{0.97}Si_{0.03})(N_{0.97}B_{0.03})$ | 92 |
| Example 52[1] | $(Al_{0.65}Cr_{0.31}Si_{0.04})(N_{0.95}O_{0.05})$ | $(Ti_{0.78}Si_{0.22})N$ | 118 |
| Example 53[1] | $(Al_{0.65}Cr_{0.31}Si_{0.04})(N_{0.95}O_{0.05})$ | $Ti(N_{0.88}B_{0.12})$ | 121 |
| Comparative Example 27 | $(Al_{0.65}Cr_{0.35})(N_{0.97}O_{0.03})$ | $(Ti_{0.78}Zr_{0.22})N$ | 75 |
| Comparative Example 28 | $(Al_{0.65}Cr_{0.35})(N_{0.97}O_{0.03})$ | $(V_{0.75}Zr_{0.25})N$ | 67 |

Note:
[1]Surface smoothed.

Examples 37–42 each having an additional film shown in Table 5 immediately on the hard film of Example 29 were longer in cutting length and better in wear resistance than the hard film of Example 29. Example 43 having an additional film shown in Table 5 immediately on the hard film of Example 31 was longer in cutting life and better in wear resistance than Example 31. Examples 44–50 each having an additional film shown in Table 5 immediately on the hard film of Example 27 were longer in cutting length and better in wear resistance than Example 27. The tools of Examples 51–53 obtained by smoothing the film surfaces of Examples 45, 46 and 50 by mechanical working had as long life as 1.2 times at maximum. The films of TiZrN and VZrN in Comparative Examples 27 and 28 had poor adhesion to the hard film of the present invention, failing to further improve the wear resistance. It is thus clear that the formation of at least one of a hard film comprising at least one metal selected from the group consisting of Ti, Cr, Al and Si, and N and at least one non-metal element of C, O and/or B, a hard carbon film, and a boron nitride film immediately on the hard film of the present invention is preferable for increasing the tool life.

What is claimed is:

1. A hard film formed by an arc-discharge ion-plating method, having a composition comprising metal components represented by $Al_xCr_{1-x}$, wherein x is an atomic ratio meeting $0.45 \leq x \leq 0.75$, and non-metal components represented by $N_{1-\alpha-\beta-\gamma}B_\alpha C_\beta O_\gamma$, wherein α, β and γ are respectively atomic ratios meeting $0 \leq \alpha \leq 0.15$, $0 \leq \beta \leq 0.35$, and $0.01 \leq \gamma \leq 0.25$; said hard film having the maximum X-ray diffraction intensity in a (200) face or a (111) face, and the binding energy of Al and/or Cr to oxygen in a range of 525–535 eV in an X-ray photoelectron spectroscopy.

2. The hard film according to claim 1, wherein its elastic recovery ratio E determined by a nano-indentation method is 28–42%.

3. The hard film according to claim 1, wherein it has a surface smoothed by mechanical working.

4. The hard film according to claim 1, wherein a ratio of said non-metal components to said metal components is 1.1 or more.

5. A hard film formed by an arc-discharge ion-plating method, having a composition comprising metal components represented by $Al_xCr_{1-x-y}Si_y$, wherein x and y are respectively atomic ratios meeting $0.45 \leq x \leq 0.75$, and $0 < y \leq 0.35$, and non-metal components represented by $N_{1-\alpha-\beta-\gamma}B_\alpha C_\beta O_\gamma$, wherein $\alpha$, $\beta$ and $\gamma$ are respectively atomic ratios meeting $0 \leq \alpha \leq 0.15$, $0 \leq \beta \leq 0.35$, and $\gamma \leq 0.25$; said hard film having the binding energy of Al, Cr and/or Si to oxygen in a range of 525–535 eV in an X-ray photoelectron spectroscopy.

6. The hard film according to claim 5, wherein Si exists in the form of a nitride, an oxide and a metal, and wherein when the relative intensities of the Si metal and its nitride and oxide determined by X-ray photoelectron spectroscopy are represented by I(Si), I(Si—N) and I(Si—O), respectively, with I(Si)+I(Si—N)+I(Si—O)=100%, I(Si—N) is 52% or more.

7. The hard film according to claim 5, wherein it has a crystal structure having the maximum X-ray diffraction intensity in a (200) face or a (111) face.

8. The hard film according to claim 5, wherein its elastic recovery ratio E determined by a nano-indentation method is 28–42%.

9. The hard film according to claim 5, wherein it has a surface smoothed by mechanical working.

10. The hard film according to claim 5, wherein a ratio of said non-metal components to said metal components is 1.1 or more.

11. A hard film formed by an arc-discharge ion-plating method, having a composition comprising metal components represented by $Al_x Cr_{1-x-y} Si_y$, wherein x and y are respectively atomic ratios meeting $0.45 \leq x \leq 0.75$, $0 \leq y \leq 0.35$, and $0.5 \leq x+y < 1$, and non-metal components represented by $N_{1-\alpha-\beta-\gamma}B_\alpha C_\beta O_\gamma$, wherein $\alpha$, $\beta$ and $\gamma$ are respectively atomic ratios meeting $0 \leq \alpha \leq 0.15$, $0 \leq \beta \leq 0.35$, and $0.003 \leq \gamma \leq 0.25$; said hard film having an NaCl-type crystal structure in an X-ray diffraction, with a half width of 2θ at a diffraction peak corresponding to a (111) face or a (200) face being 0.5–2.0°; and said hard film containing oxygen more in grain boundaries than in crystal grains.

12. The hard film according to claim 11, wherein said hard film has the binding energy of Al, Cr and/or Si to oxygen in a range of 525–535 eV in an X-ray photoelectron spectroscopy.

13. The hard film according to claim 11, wherein said hard film has the maximum oxygen concentration in a region of depth within 500 nm from the outermost surface.

14. The hard film according to claim 11, wherein it meets $0.3 < I(200)/I(111) < 12$, wherein I(111) and I(200) are the X-ray diffraction intensities of a (111) face and a (200) face, respectively.

15. The hard film according to claim 11, wherein its elastic recovery ratio E determined by a nano-indentation method is 28–42%.

16. The hard film according to claim 11, wherein it has a surface smoothed by mechanical working.

17. The hard film according to claim 11, wherein a ratio of said non-metal components to said metal components is 1.1 or more.

* * * * *

UNITED STATES PATENT AND TRADEMARK OFFICE
CERTIFICATE OF CORRECTION

PATENT NO. : 7,166,155 B2
APPLICATION NO. : 10/714630
DATED : January 23, 2007
INVENTOR(S) : Takeshi Ishikawa It is certified that error appears in the above-identified patent and that said Letters Patent is hereby corrected as shown below:

On Title Page
Please correct the Assignee's name as it appears on the patent.

Please delete item "(73) Hitachi Tools Engineering, Ltd. Tokyo (JP)" and insert --(73) Hitachi Tool Engineering, Ltd. Tokyo (JP)--

Signed and Sealed this

Sixth Day of November, 2007

JON W. DUDAS
*Director of the United States Patent and Trademark Office*